US010262946B2

(12) United States Patent
Gozu et al.

(10) Patent No.: US 10,262,946 B2
(45) Date of Patent: Apr. 16, 2019

(54) WIRING SUBSTRATE AND SEMICONDUCTOR DEVICE

(71) Applicant: SHINKO ELECTRIC INDUSTRIES CO., LTD., Nagano-Shi, Nagano-Ken (JP)

(72) Inventors: Yusuke Gozu, Nagano (JP); Yuta Sakaguchi, Nagano (JP); Norikazu Nakamura, Nagano (JP); Noriyoshi Shimizu, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 15/685,504

(22) Filed: Aug. 24, 2017

(65) Prior Publication Data

US 2018/0061765 A1    Mar. 1, 2018

(30) Foreign Application Priority Data

Aug. 29, 2016 (JP) ................................. 2016-167227

(51) Int. Cl.
| | | |
|---|---|---|
| *H01L 23/48* | (2006.01) | |
| *H01L 23/538* | (2006.01) | |
| *H01L 23/60* | (2006.01) | |
| *H01L 25/07* | (2006.01) | |

(52) U.S. Cl.
CPC ...... *H01L 23/5384* (2013.01); *H01L 23/5383* (2013.01); *H01L 23/5386* (2013.01); *H01L 23/60* (2013.01); *H01L 25/074* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC ............. H01L 23/5384; H01L 23/5383; H01L 23/5386; H01L 23/49822; H01L 23/49827
USPC ......................................... 257/698, 700, 778
See application file for complete search history.

(56) References Cited

U.S. PATENT DOCUMENTS

| | | | | |
|---|---|---|---|---|
| 2015/0357276 A1* | 12/2015 | Shimizu | ............ | H01L 23/49838 361/783 |
| 2016/0020163 A1* | 1/2016 | Shimizu | ............ | H01L 23/49822 361/768 |

FOREIGN PATENT DOCUMENTS

JP         2016-029697 A      3/2016

* cited by examiner

*Primary Examiner* — Brook Kebede
(74) *Attorney, Agent, or Firm* — Tarolli, Sundheim, Covell & Tummino LLP

(57) ABSTRACT

A wiring substrate includes a first wiring structure and a second wiring structure having a higher wiring density. The second wiring structure includes a wiring layer formed on a first insulation layer of the first wiring structure. The wiring layer includes a first wiring pattern, the upper surface of which includes smooth and rough surfaces. A protective film, formed from a conductive material having a higher migration resistance than the wiring layer, covers only the smooth surface and includes a smooth upper surface. A second insulation layer stacked on the first insulation layer covers the wiring layer and the protective film. The smooth surface is continuous with and downwardly recessed from the smooth surface to expose a peripheral portion of the protective film. The second insulation layer covers upper, lower, and side surfaces of the peripheral portion.

9 Claims, 19 Drawing Sheets

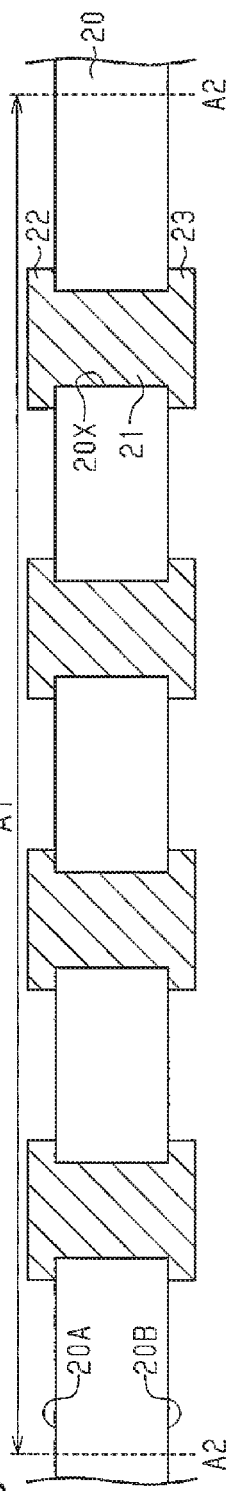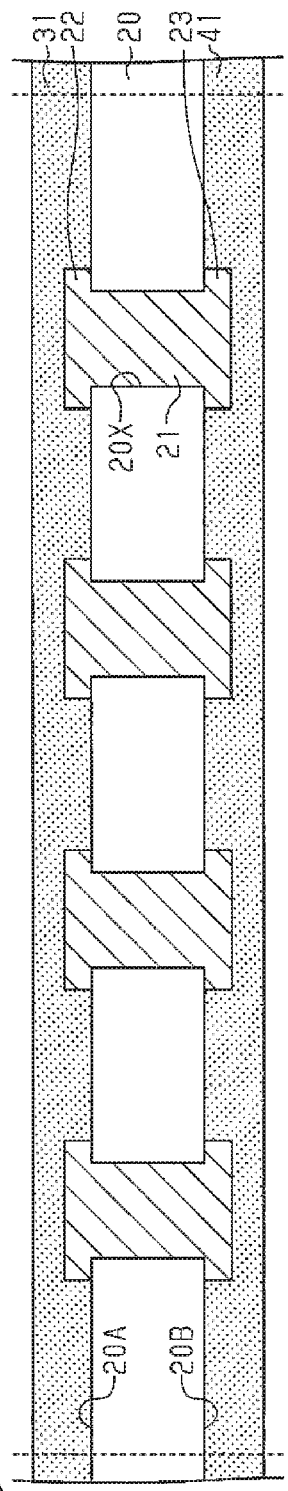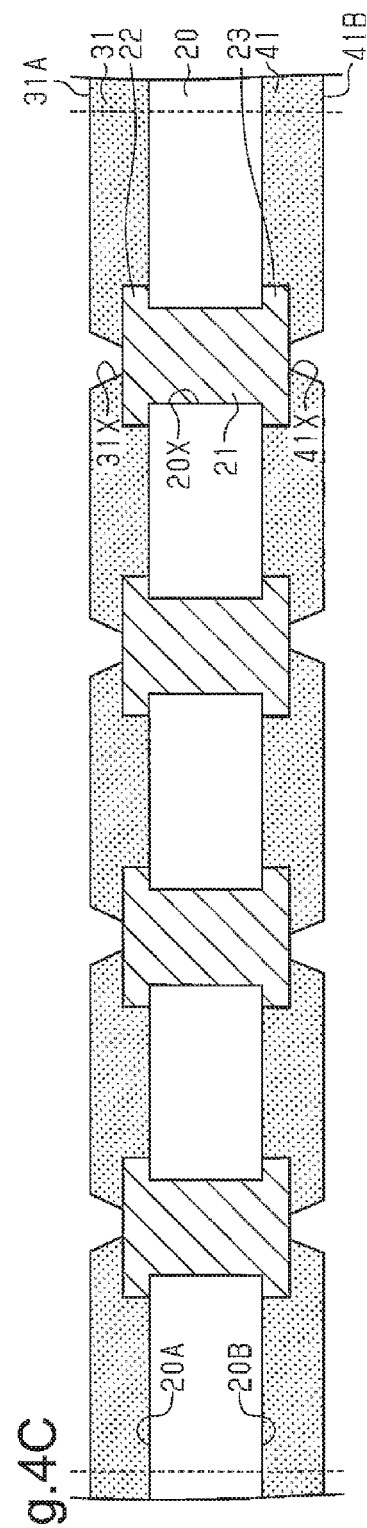

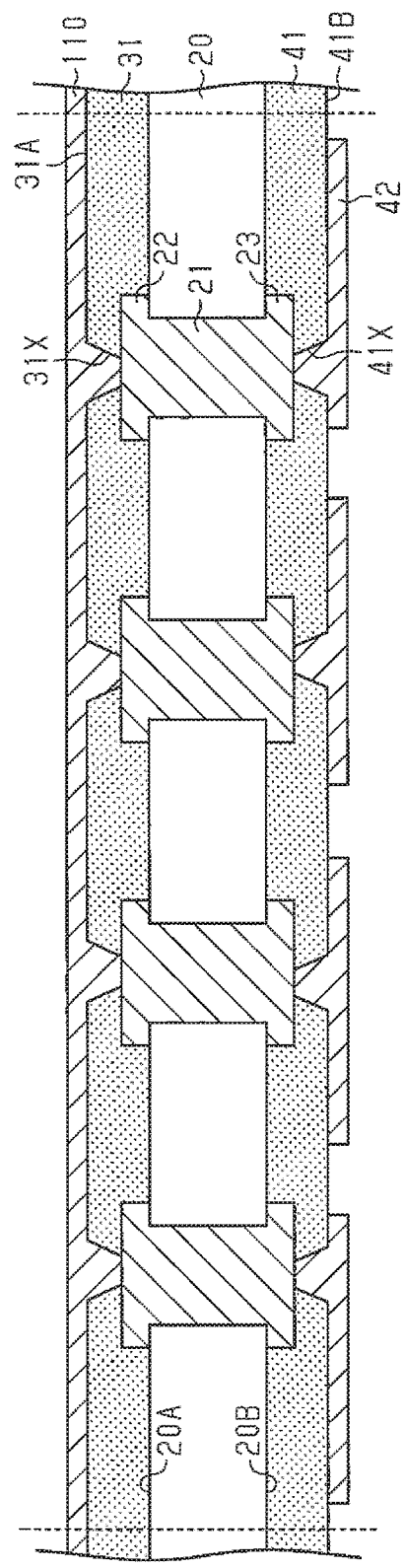
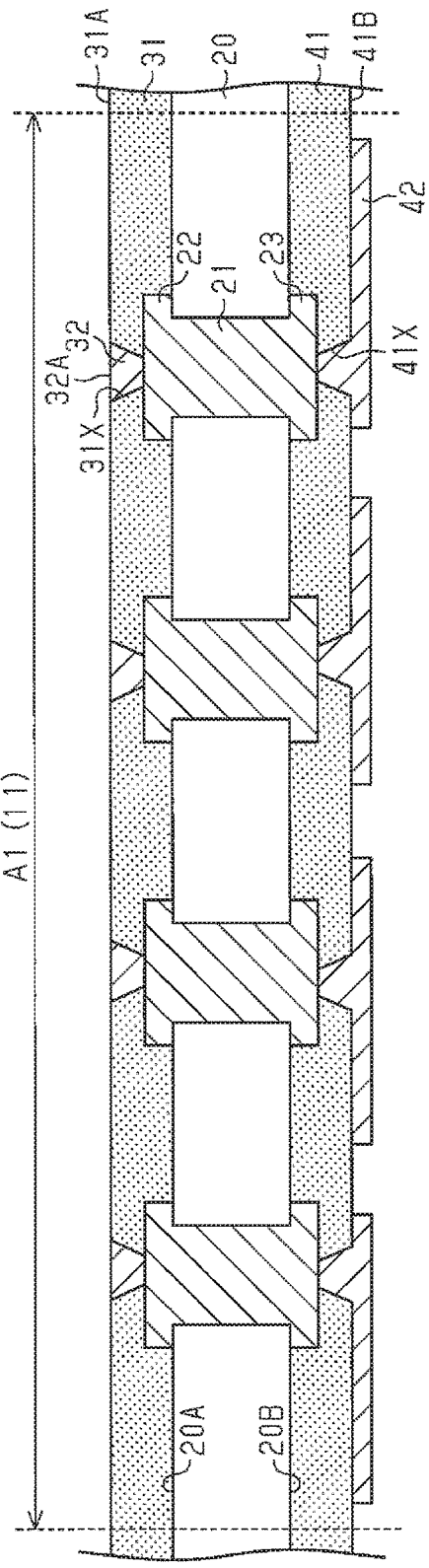
Fig.5A
Fig.5B

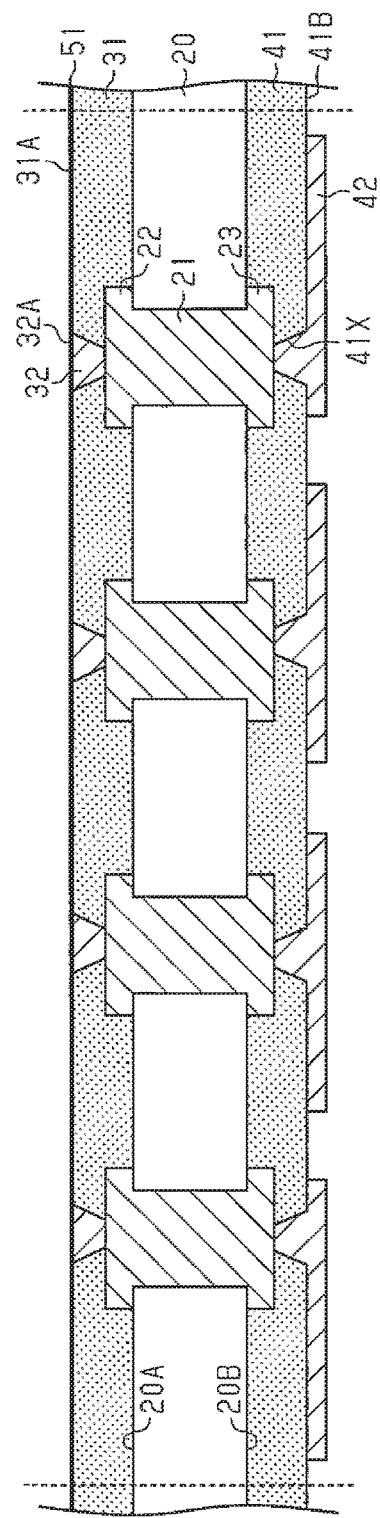
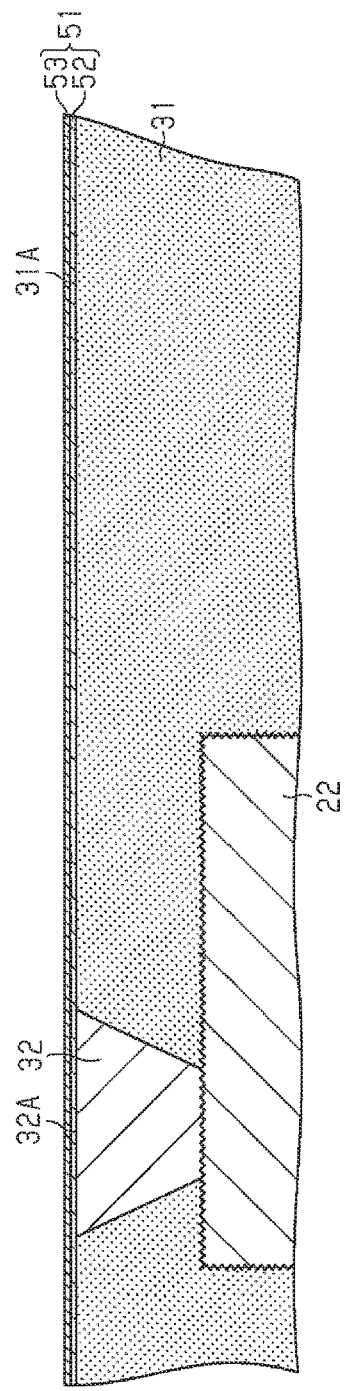

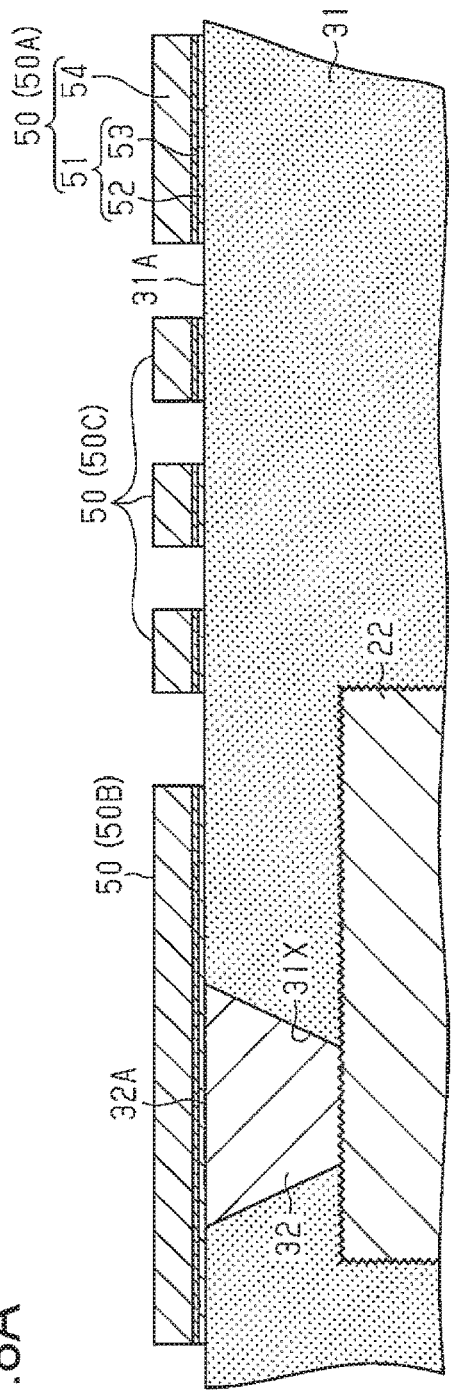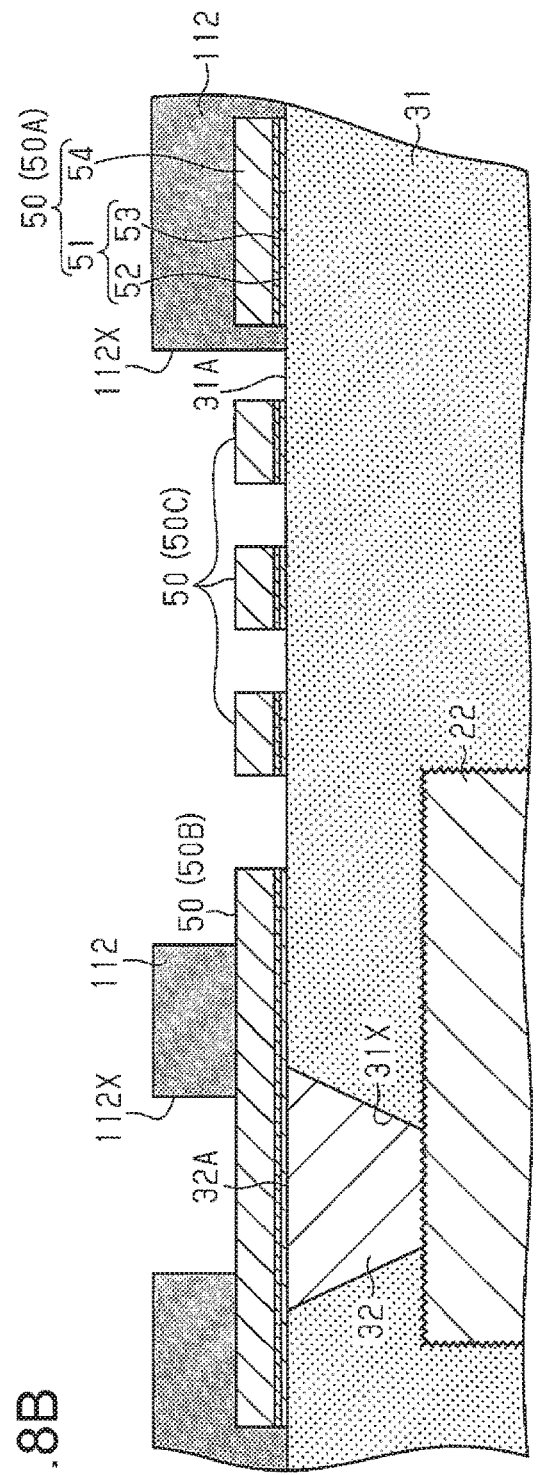

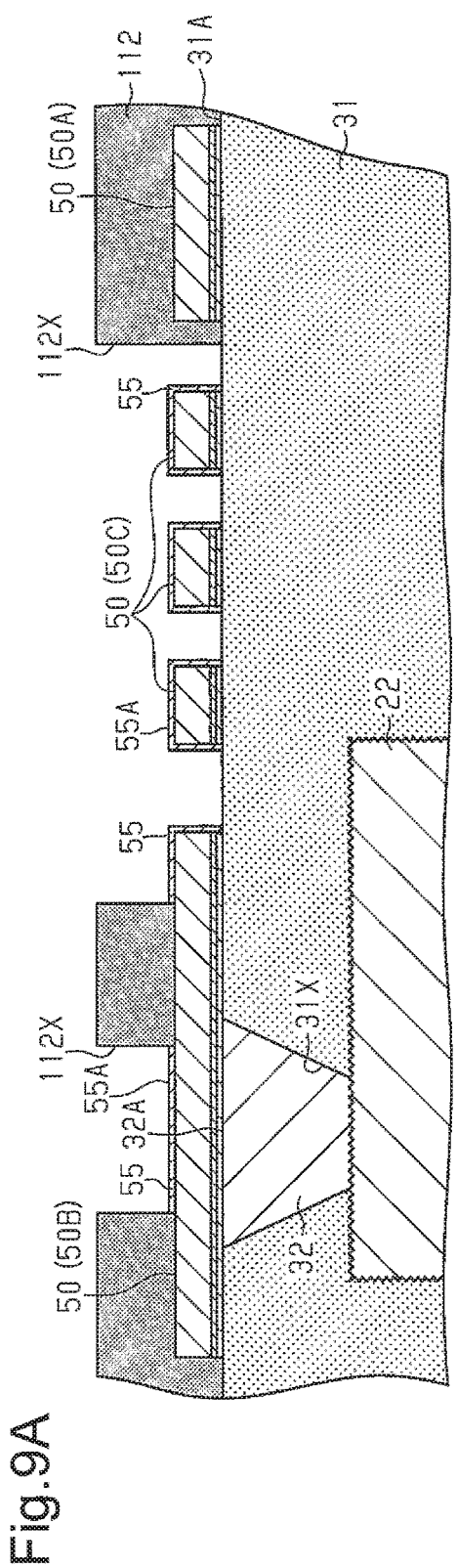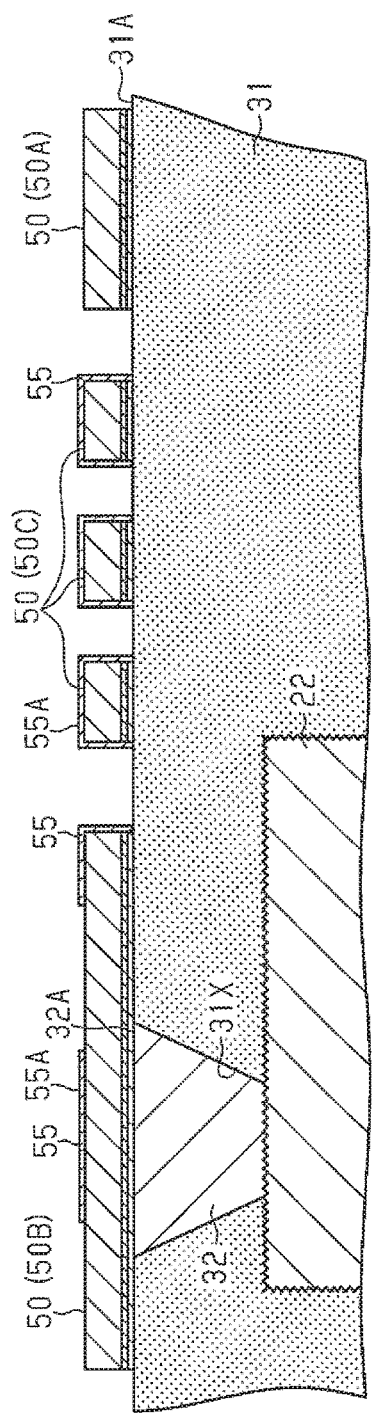

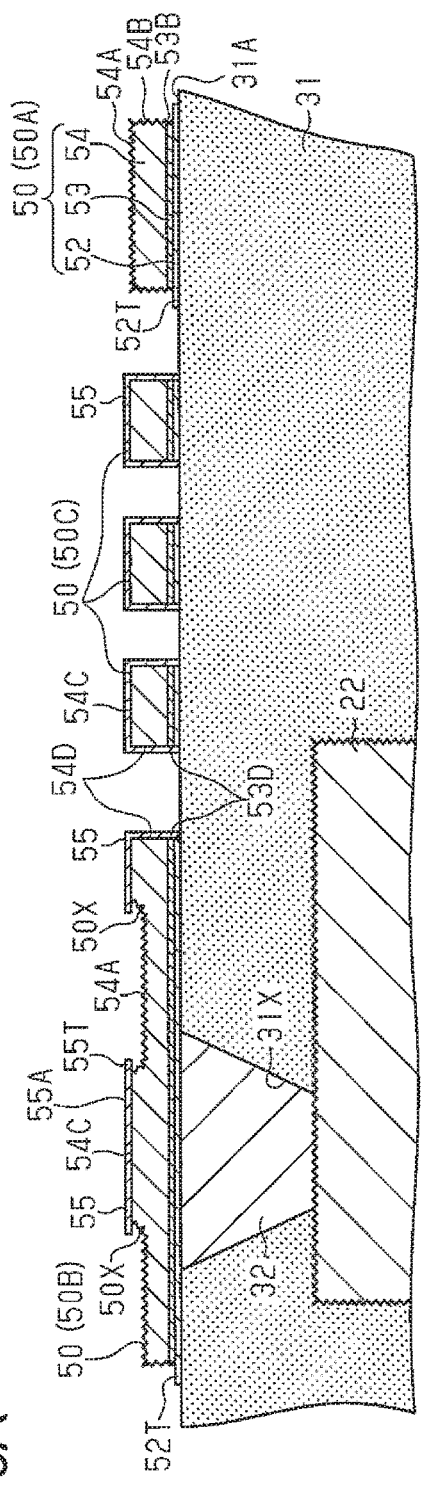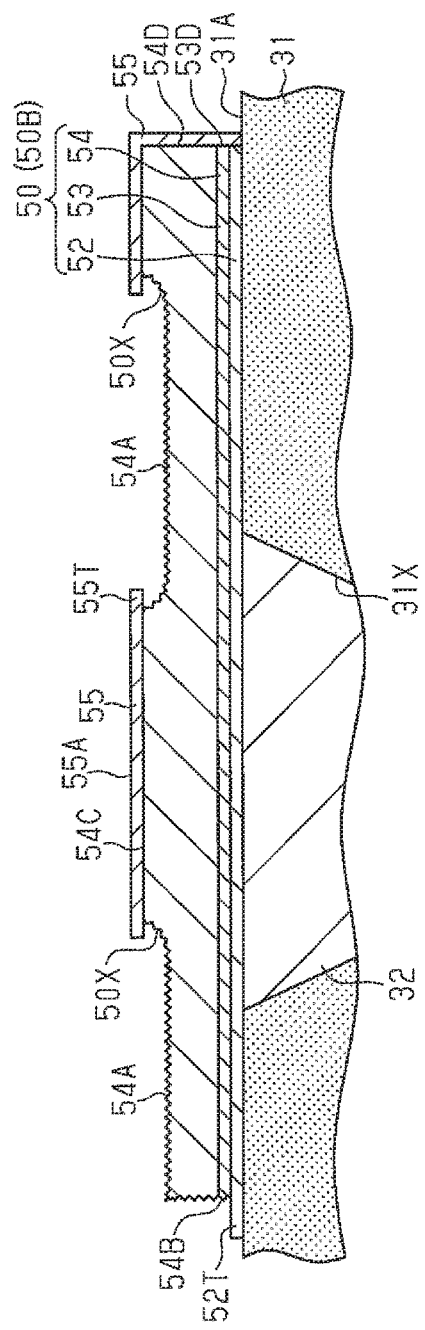

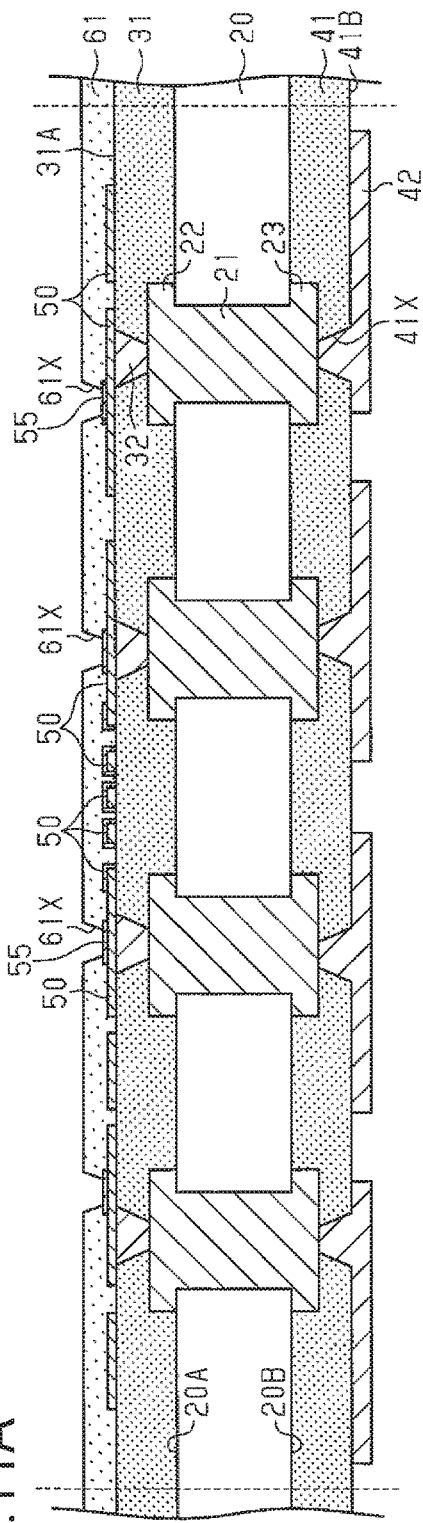
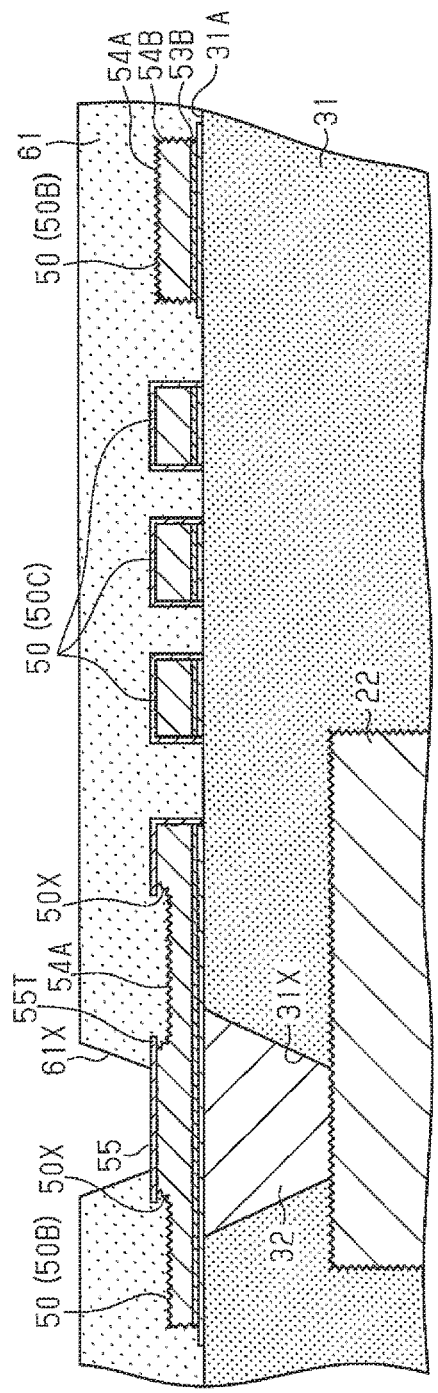
Fig.11A
Fig.11B

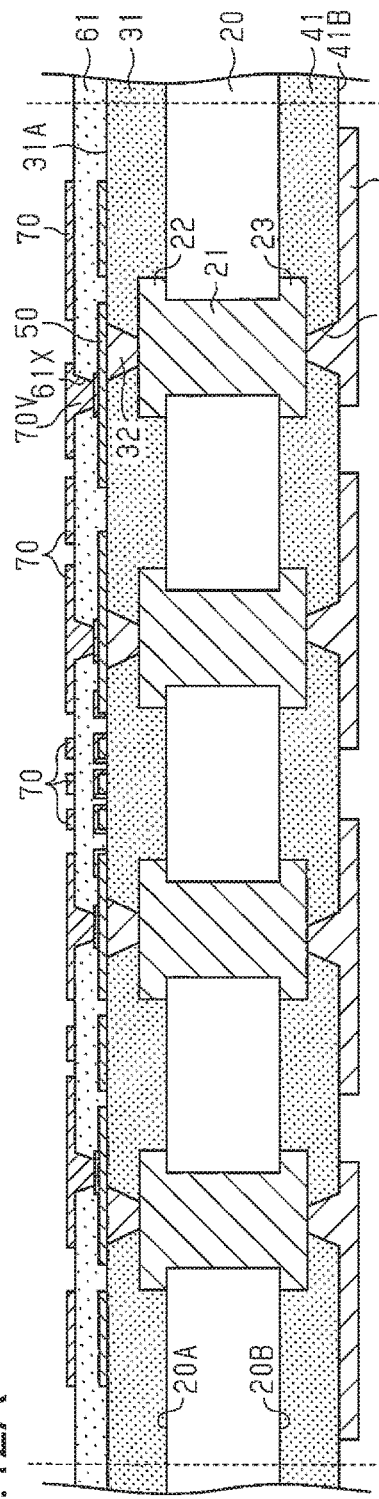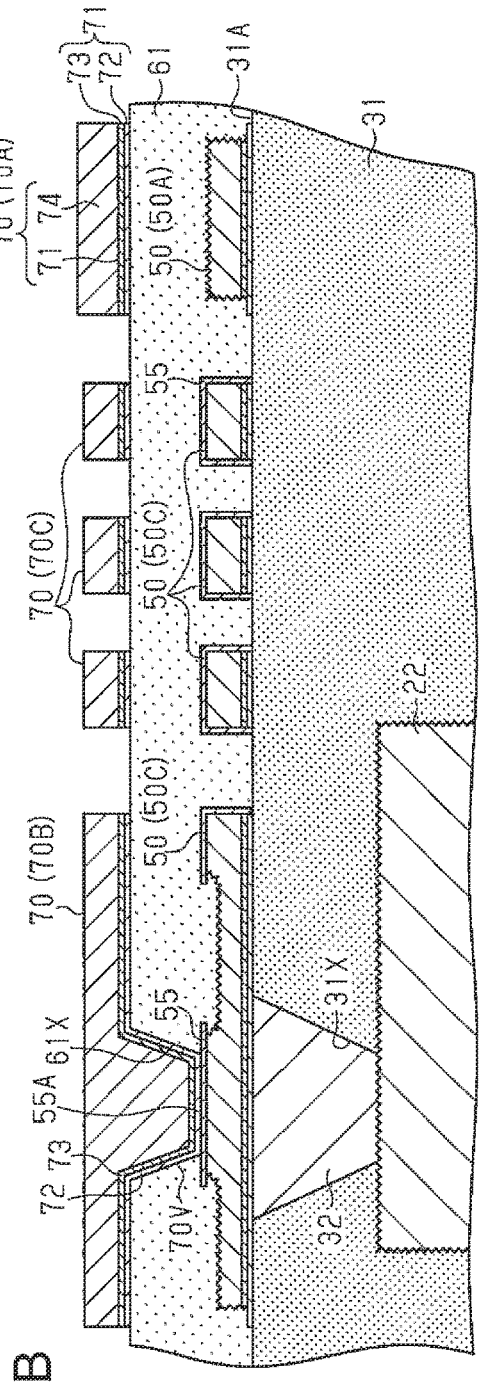
Fig. 12A
Fig. 12B

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2016-167227, filed on Aug. 29, 2016, the entire contents of which are incorporated herein by reference.

FIELD

This disclosure relates to a wiring substrate, a semiconductor device, and a method for manufacturing a wiring substrate.

BACKGROUND

Electronic components such as semiconductor chips are mounted on a wiring substrate. Such a wiring substrate is manufactured through a build-up process so that the density of wiring patterns is increased. The build-up process alternately stacks wiring layers and insulation layers. Japanese Laid-Open Patent Publication No. 2016-29697 describes a related art wiring substrate. In the wiring substrate, a high-density wiring layer, which includes an insulation layer formed from a photosensitive resin, is formed on a low-density wiring layer, which includes an insulation layer formed from a thermosetting resin.

FIG. 19 is a partially enlarged cross-sectional view of a related art wiring substrate. A wiring substrate 200 includes a low-density wiring layer 210 and a high-density wiring layer 220. The wiring layer 220 is stacked on the upper surface of an uppermost insulation layer 211 of the low-density wiring layer 210. The insulation layer 211 is formed from an insulative resin, the main component of which is a thermosetting resin. The high-density wiring layer 220 has a structure in which a wiring layer 221, an insulation layer 222, a wiring layer 223, an insulation layer 224, a wiring layer 225, an insulation layer 226, and a wiring layer 227 are sequentially stacked on the upper surface of the insulation layer 211. The wiring layer 221 and the wiring layer 223 are electrically connected by a via wiring V1 which extends through the insulation layer 222 in the thickness-wise direction. The wiring layer 223 and the wiring layer 225 are electrically connected by a via wiring V2 which extends through the insulation layer 224 in the thickness-wise direction. The wiring layer 225 and the wiring layer 227 are electrically connected by a via wiring V3 which extends through the insulation layer 226 in the thickness-wise direction. The insulation layers 222, 224, 226 are formed from an insulative resin, the main component of which is a photosensitive resin.

To limit adverse effects on the insulation property caused by electromigration, a protective film 230 is partially formed on the surface of each of the wiring layers 221, 223, 225. The protective films 230 mainly cover fine wiring portions. The surfaces of the wiring layers 221, 223, 225 exposed from the protective films 230 are formed as rough surfaces 221R, 223R, 225R, respectively. The rough surfaces 221R, 223R, 225R are located on wiring portions having large surface areas such as a plane layer or a land. The formation of the rough surfaces 221R, 223R, 225R increases the adhesiveness of the wiring layers 221, 223, 225, which include the high-density wirings, and the insulation layers 222, 224, 226.

In the wiring substrate 200, the bottoms of the via wirings V1 to V3 are respectively connected to the rough surfaces 221R, 223R, 225R. With this structure, voids tend to be formed in boundary surfaces of the rough surfaces 221R, 223R, 225R and the bottoms of the via wirings V1 to V3. For example, voids tend to be formed in boundary surfaces of metal barrier films defining the bottoms of the via wirings V1 to V3 and irregular surfaces of the rough surfaces 221R, 223R, 225R. Such voids may lower the connection reliability of the wiring layers 221, 223, 225 and the via wirings V1 to V3.

SUMMARY

One embodiment is a wiring substrate that includes a first wiring structure and a second wiring structure. The first wiring structure includes a first wiring layer, a first insulation layer that covers the first wiring layer, a first through hole that extends through the first insulation layer in a thickness-wise direction and exposes an upper surface of the first wiring layer, and a first via wiring, with which the first through hole is filled, wherein the first via wiring includes an upper end surface that is exposed from the first insulation layer. The second wiring structure is stacked on an upper surface of the first insulation layer and has a higher wiring density than the first wiring structure. The second wiring structure includes a second wiring layer, a protective film, a second insulation layer, a second through hole, and a third wiring layer. The second wiring layer is formed on the upper surface of the first insulation layer and the upper end surface of the first via wiring. The second wiring layer includes a first wiring pattern. The first wiring pattern includes a smooth surface and a rough surface having a higher roughness than the smooth surface. The smooth surface forms a portion of an upper surface of the first wiring pattern. The rough surface forms a remaining portion of the upper surface of the first wiring pattern. The protective film is formed from a conductive material having a higher migration resistance than the second wiring layer. The protective film covers the smooth surface and exposes the rough surface. The protective film includes a smooth upper surface having a lower roughness than the rough surface. The second insulation layer is stacked on the upper surface of the first insulation layer. The second insulation layer covers the second wiring layer and the protective film. The second through hole extends through the second insulation layer in the thickness-wise direction and exposes an upper surface of the protective film. The third wiring layer includes a second via wiring, with which the second through hole is filled. The third wiring layer is connected to the second wiring layer by the second via wiring. The rough surface is continuous with the smooth surface and downwardly recessed from the smooth surface to expose a lower surface of a peripheral portion of the protective film. The second insulation layer covers a side surface, an upper surface, and the lower surface of the peripheral portion of the protective film.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 4A to 4C, 5A, 5B, 6A, 6B, 7A, 7B, 8A, 8B, 9A, 9B, 10A, 10B, 11A, 11B, 12A, 12B, and 13 to 15 are schematic cross-sectional views illustrating a method for manufacturing the wiring substrate of FIG. 1 where FIGS. 6B, 7B, 10B, 11B, and 12B are partially enlarged views of FIGS. 6A, 7A, 10A, 11A, and 12A, respectively;

DESCRIPTION OF THE EMBODIMENTS

Figure 1:
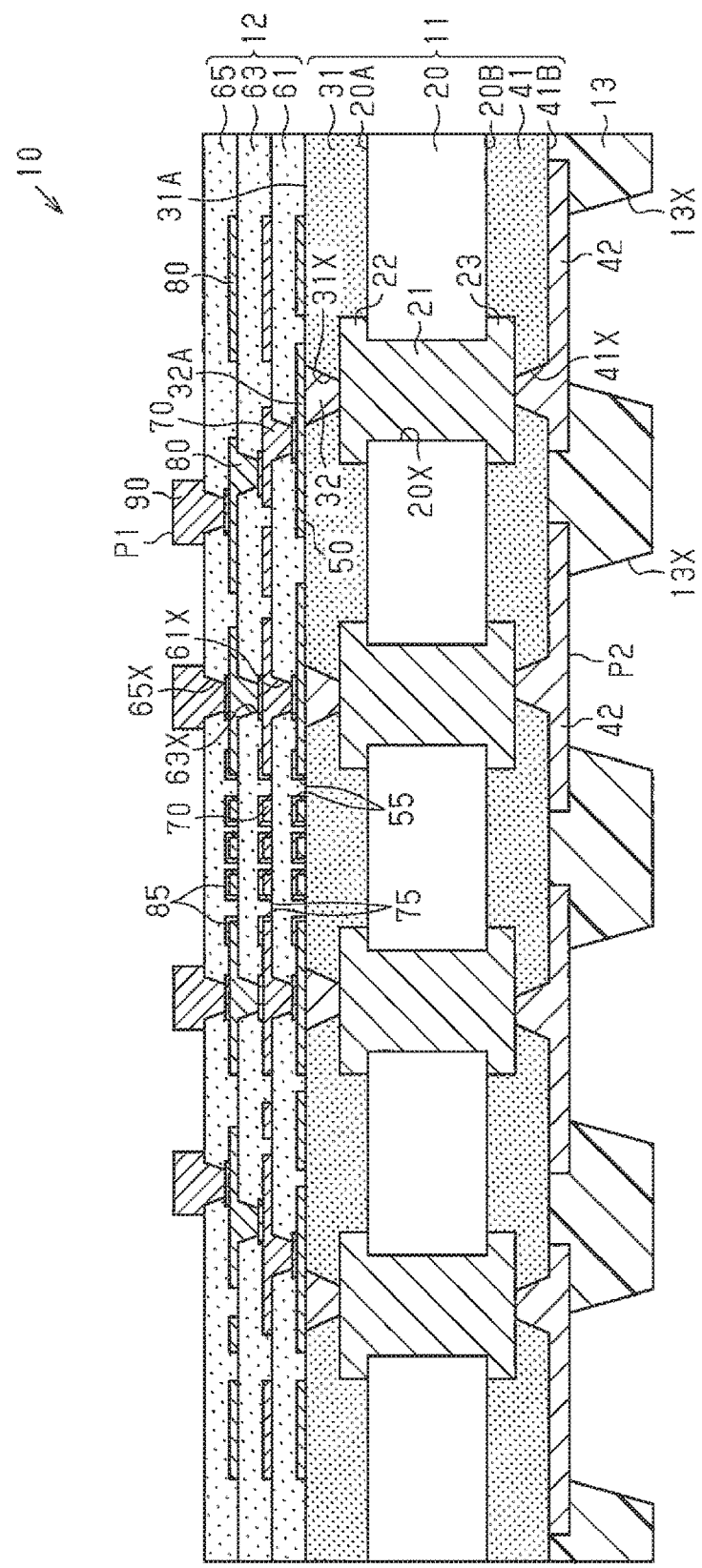
FIG. 1 is a schematic cross-sectional view illustrating one embodiment of a wiring substrate.

One embodiment will now be described with reference to the accompanying drawings. Elements in the drawings may be partially enlarged for simplicity and clarity and thus have not necessarily been drawn to scale. To facilitate understanding, hatching lines may not be shown or be replaced by shadings in the cross-sectional drawings.

As illustrated in FIG. 1, a wiring substrate 10 includes a wiring structure 11, a wiring structure 12 stacked on one side (upper side in FIG. 1) of the wiring structure 11, and a solder resist layer 13 stacked on the other side (lower side in FIG. 1) of the wiring structure 11.

The wiring structure 11 will now be described. The wiring structure 11 includes a low-density wiring layer that includes wiring layers having a lower wiring density than the wiring structure 12. The wiring structure 11 includes a core substrate 20, an insulation layer 31 stacked on an upper surface 20A of the core substrate 20, and an insulation layer 41 stacked on a lower surface 20B of the core substrate 20.

The material of the core substrate 20 and the insulation layers 31, 41 may be, for example, a non-photosensitive insulative resin, the main component of which is a thermosetting resin. Alternatively, the material of the core substrate 20 and the insulation layers 31, 41 may be, for example, a thermosetting insulative resin containing a reinforcement material. The material of the core substrate 20 and the insulation layers 31, 41 may be, for example, a glass-epoxy resin formed by impregnating a glass cloth (glass woven cloth), which serves as a reinforcement material, with a thermosetting insulative resin, the main component of which is an epoxy resin, and curing the resin. The reinforcement material is not limited to a glass cloth and may be, for example, a glass non-woven cloth, an aramid woven cloth, an aramid non-woven cloth, a liquid crystal polymer (LCP) woven cloth, or an LCP non-woven cloth. The thermosetting insulative resin is not limited to an epoxy resin. For example, an insulative resin such as a polyimide resin or a cyanate resin may be used as the thermosetting insulative resin. The core substrate 20 and the insulation layers 31, 41 may contain, for example, a filler such as silica or alumina.

The core substrate 20 is located in the middle of the wiring structure 11 in the thickness-wise direction. The thickness of the core substrate 20 may be, for example, approximately 60 to 1000 μm. Through holes 20X extend through the core substrate 20 in the thickness-wise direction at given locations (four in FIG. 1). Through electrodes 21 extend in the through holes 20X through the core substrate 20 in the thickness-wise direction. The through holes 20X are, for example, filled with the through electrodes 21. The material of the through electrodes 21 may be, for example, copper (Cu) or a copper alloy.

A wiring layer 22 is formed on the upper surface 20A of the core substrate 20. A wiring layer 23 is formed on the lower surface 20B of the core substrate 20. The wiring layers 22, 23 are electrically connected to each other by the through electrodes 21. The material of the wiring layers 22, 23 may be, for example, copper or a copper alloy. The thickness of the wiring layers 22, 23 may be, for example, approximately 15 to 35 μm. The line and space (L/S) of the wiring layers 22, 23 may be, for example, approximately 20 μm/20 μm. The line and space (L/S) indicates the wiring width and the wiring space between adjacent wirings.

As illustrated in 2A, surfaces (upper and side surfaces) of the wiring layer 22 are formed by rough surfaces. The surface roughness of the wiring layer 22 may be set so that, for example, a surface roughness Ra value is greater than or equal to 200 nm. The surface roughness Ra value is also referred to as the arithmetic average roughness, which is obtained by calculating the arithmetic average of absolute values of heights that change from the surface defined as the average line within the measurement region. In the same manner as the wiring layer 22, surfaces (lower and side surfaces) of the wiring layer 23, which is illustrated in FIG. 1, are also formed by rough surfaces.

As illustrated in FIG. 1, the insulation layer 31 is stacked on the upper surface 20A of the core substrate 20. Via wirings 32 are formed in the insulation layer 31. The insulation layer 31 covers the wiring layer 22. The insulation layer 31 is set, for example, to be thinner than the core substrate 20. The thickness of the insulation layer 31 may be, for example, approximately 40 to 75 μm.

Through holes 31X extend through the insulation layer 31 in the thickness-wise direction at given locations to partially expose the upper surface of the wiring layer 22. Each through hole 31X is tapered so that the diameter is decreased from the upper side (side close to wiring structure 12) toward the lower side (side close to core substrate 20) in FIG. 1. The through hole 31X is shaped, for example, as an inverted truncated cone so that the upper open end has a larger diameter than the lower open end.

The insulation layer 31 includes an upper surface 31A formed by a smooth surface having small irregularities (surface having low roughness). The upper surface 31A of the insulation layer 31 is, for example, a polished surface. The upper surface 31A of the insulation layer 31 has, for example, a lower surface roughness than wall surfaces defining the through holes 31X and a lower surface 41B of the insulation layer 41. The roughness of the upper surface 31A of the insulation layer 31 is set so that the surface roughness Ra value is, for example, approximately 15 to 40 nm. The roughness of the wall surfaces of the through holes 31X and the roughness of the lower surface 41B of the insulation layer 41 are set so that the surface roughness Ra value is, for example, approximately 300 to 400 nm.

The via wirings 32 are formed in the through holes 31X and electrically connected to the wiring layer 22. The through holes 31X are filled with the via wirings 32, which extend through the insulation layer 31 in the thickness-wise direction. In the same manner as the through holes 31X, each via wiring 32 is tapered so that the diameter is decreased from the upper side (side close to wiring structure 12) toward the lower side (side close to core substrate 20) in FIG. 1. The via wiring 32 is, for example, shaped as an inverted truncated cone so that an upper end surface 32A of the via wiring 32 has a larger diameter than a lower end surface of the via wiring 32. The diameter of the upper end surface 32A of the via wiring 32 may be, for example, approximately 50 to 70 µm.

The upper end surface 32A of the via wiring 32 is exposed from the upper surface 31A of the insulation layer 31. The upper end surface 32A of the via wiring 32 is, for example, substantially flush with the upper surface 31A of the insulation layer 31. In the same manner as the upper surface 31A of the insulation layer 31, the upper end surface 32A of the via wiring 32 is formed by a smooth surface having small irregularities (surface having low roughness). The upper end surface 32A of the via wiring 32 is, for example, polished. The roughness of the upper end surface 32A of the via wiring 32 is set so that the surface roughness Ra value is, for example, approximately 15 to 40 nm. The material of the via wiring 32 may be, for example, copper or a copper alloy.

The insulation layer 41 and a wiring layer 42 are sequentially stacked on the lower surface 20B of the core substrate 20. The insulation layer 41 is stacked on the lower surface 20B of the core substrate 20 to cover the wiring layer 23. The insulation layer 41 is, for example, thinner than the core substrate 20. The thickness of the insulation layer 41 may be, for example, approximately 40 to 75 µm.

The wiring layer 42 is stacked on the lower surface 41B of the insulation layer 41 and electrically connected to the wiring layer 23. The wiring layer 42 includes via wirings, with which through holes 41X are filled, and wiring patterns, which are formed on the lower surface 41B of the insulation layer 41. The material of the wiring layer 42 may be, for example, copper or a copper alloy.

The wiring structure 12 will now be described. The wiring structure 12 is stacked on the upper surface 31A of the uppermost insulation layer 31 of the wiring structure 11. The wiring structure 12 includes a high-density wiring layer that includes wiring layers having a higher wiring density than the wiring structure 11.

The wiring structure 12 includes a wiring layer 50, an insulation layer 61, a wiring layer 70, an insulation layer 63, a wiring layer 80, an insulation layer 65, and a wiring layer 90, which are sequentially stacked on the upper surface 31A of the insulation layer 31. The wiring structure 12 further includes protective films 55, 75, 85, which are partially formed on surfaces of the wiring layers 50, 70, 80, respectively.

The material of the insulation layers 61, 63, 65 may be a photosensitive insulative resin, the main component of which is, for example, a phenol resin or polyimide resin. Alternatively, the material of the insulation layers 61, 63, 65 may be a photosensitive insulative resin, the main component of which is, for example, a silicone resin, an epoxy resin, a cycloolefin resin, or a benzocyclobutene resin. The insulation layers 61, 63, 65 may contain, for example, a filler such as silica or alumina.

Each of the wiring layers 50, 70, 80, 90 includes wirings that are finer than the wiring layers of the wiring structure 11. For example, the line and space (L/S) of each of the wiring layers 50, 70, 80, 90 may be, for example, less than 5 µm/5 µm. Additionally, the wiring layers 50, 70, 80, 90 are thinner than the wiring layers of the wiring structure 11. The thickness of each of the wiring layers 50, 70, 80 may be, for example, approximately 1 to 3 µm. The thickness of the wiring layer 90 may be, for example, approximately 10 to 15 µm. The insulation layers 61, 63, 65 are each thinner than the insulation layers of the wiring structure 11. The thickness of each of the insulation layers 61, 63, 65 may be, for example, approximately 3 to 10 µm.

Figure 2:
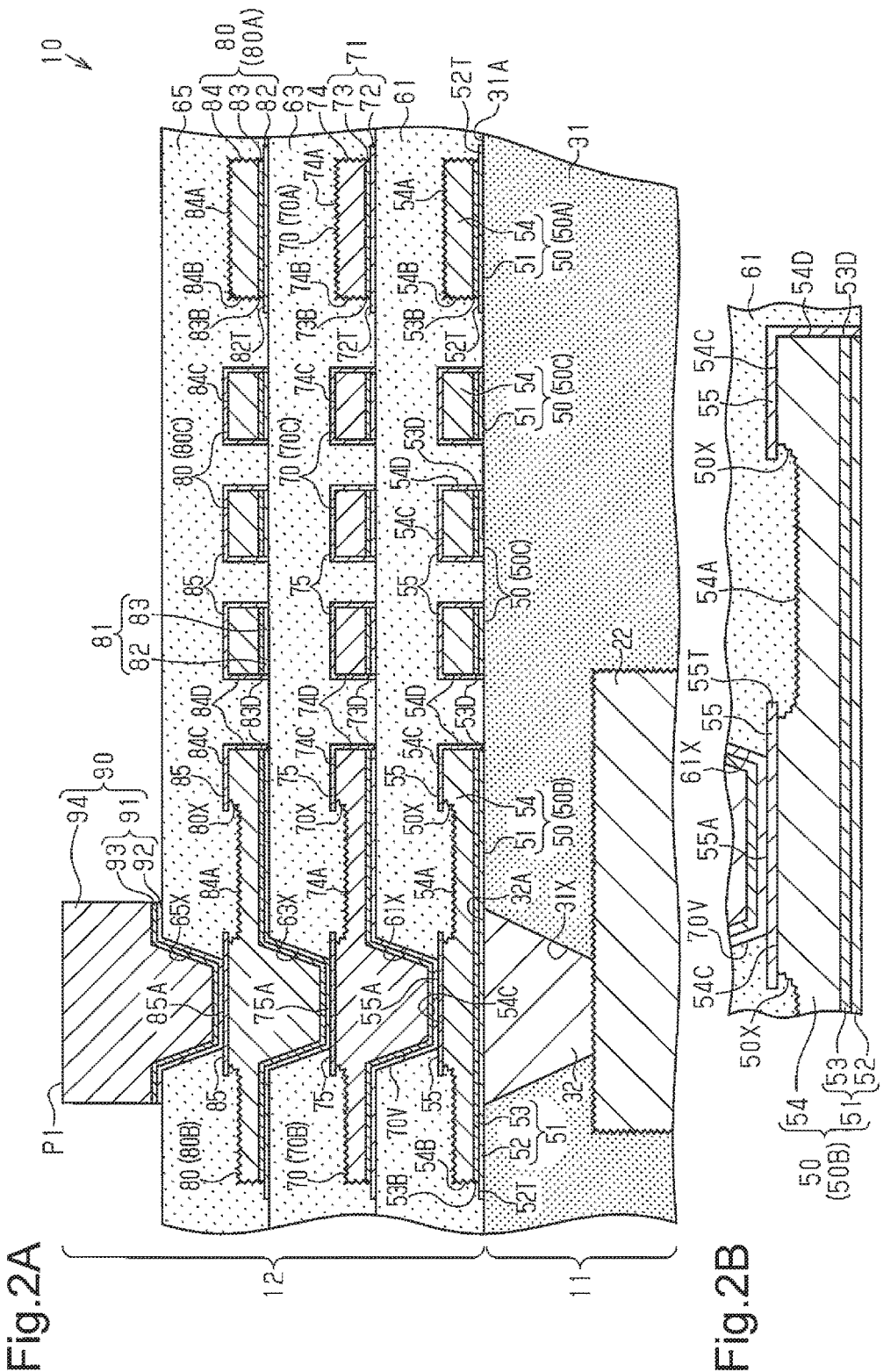
FIGS. 2A and 2B are partially enlarged cross-sectional views illustrating the wiring substrate of FIG. 1.

As illustrated in FIG. 2A, the wiring layer 50 is stacked on the upper surface 31A of the insulation layer 31 and connected to the upper end surface 32A of the via wiring 32. In the present example, the lower surface of the wiring layer 50 is partially in contact with the upper end surface 32A of the via wiring 32. This electrically connects the wiring layer 50 and the via wiring 32. Although the wiring layer 50 is electrically connected to the via wiring 32, the wiring layer 50 is not integrated with the via wiring 32.

The wiring layer 50 includes a seed layer 51, which is formed on the upper surface 31A of the insulation layer 31 and the upper end surface 32A of the via wiring 32, and a metal layer 54, which is formed on the seed layer 51. In other words, the seed layer 51 connects the metal layer 54 to the via wiring 32.

The seed layer 51 has a two-layer structure in which a metal film 52, which covers the upper end surface 32A of the via wiring 32 and the upper surface 31A of the insulation layer 31, and a metal film 53, which covers the upper surface of the metal film 52, are sequentially stacked. The metal films 52, 53 may be, for example, metal films (sputtered films) formed through sputtering. The metal film 52 functions as a metal barrier film that inhibits the dispersion of copper, for example, from the metal film 53 (e.g., Cu layer) or the metal layer 54 (e.g., Cu layer) to the insulation layer 31. It is preferred that the material of the metal film 52 be a metal that has a higher adhesiveness to the insulation layer 31 than the metal (e.g., copper) forming the metal film 53. Additionally, it is preferred that the material of the metal film 52 be a metal that has a higher corrosion resistance than the metal (e.g., copper) forming the metal film 53. Such a material of the metal film 52 may be, for example, titanium (Ti), titanium nitride (TiN), tantalum nitride (TaN), tantalum (Ta), chromium (Cr), or a nickel-copper alloy (NiCu). The material of the metal film 53 may be, for example, copper or a copper alloy. The thickness of the metal film 52 may be, for example, approximately 20 to 100 nm. The thickness of the metal film 53 may be, for example, approximately 50 to 300 nm.

The metal layer 54 covers the entire upper surface of the metal film 53. The material of the metal layer 54 may be, for example, copper or a copper alloy.

The wiring layer 50 includes wiring patterns 50A to 50C, which are, for example, coplanar with each other.

Each wiring pattern 50A is, for example, a solid pattern such as a plane layer (e.g., power supply plane, GND pattern) or a dummy pattern. The wiring pattern 50A includes the metal layer 54, the surface area of which (e.g., area of upper surface) is relatively large. The wiring pattern 50A includes a rough surface 54A, which forms the entire upper surface of the metal layer 54, a rough surface 54B, which forms the entire side surface of the metal layer 54, and a rough surface 53B, which forms the entire side surface of the metal film 53. In the wiring pattern 50A, the metal film 52 is located immediately below the rough surface 53B. The metal film 52 includes a projection 52T that outwardly projects from the rough surfaces 53B, 54B. The projection 52T defines an edge portion of the metal film 52. The upper surface of the projection 52T is exposed from the rough surfaces 53B, 54B.

Each wiring pattern 50B includes a land connected to the wiring layer 70. The wiring pattern 50B includes the metal layer 54, the surface area of which is relatively large. The surface area of the metal layer 54 of the wiring pattern 50B is, for example, larger than the surface area of the metal layer 54 of each wiring pattern 50A. The wiring pattern 50B includes a rough surface 54A, which partially forms the upper surface of the metal layer 54, and a rough surface 54B, which partially forms the side surface of the metal layer 54. Additionally, the wiring pattern 50B includes a smooth surface 54C, which forms the upper surface of the metal layer 54 excluding the rough surface 54A and has a lower roughness than the rough surface 54A, and a smooth surface 54D, which forms the side surface of the metal layer 54 excluding the rough surface 54B and has a lower roughness than the rough surface 54B. In the wiring pattern 50B, the smooth surface 54C forms at least a portion of the upper surface of the metal layer 54 on which the via wiring is formed. In the wiring pattern 50B of the present example, the smooth surface 54C also forms a portion of the upper surface of the metal layer 54 located in the proximity of the wiring patterns 50C including fine wiring. Additionally, the smooth surface 54D of the wiring pattern 50B defines the side surface of the metal layer 54 located in the proximity of the wiring patterns 50C. Further, the wiring pattern 50B includes a rough surface 53B, which forms the side surface of the metal film 53 that is in contact with the rough surface 54B, and a smooth surface 53D, which forms the side surface of the metal film 53 that is in contact with the smooth surface 54D and has a lower roughness than the rough surface 54B. In the wiring pattern 50B, the metal film 52 located immediately below the rough surface 53B includes a projection 52T that projects from the rough surface 53B. In the wiring pattern 50B, the side surface of the metal film 52 located immediately below the smooth surface 53D is substantially flush with the smooth surfaces 53D, 54D. Thus, the wiring pattern 50B includes the smooth surfaces 54C, 54D, 53D, which form a portion of the surface of the wiring pattern 50B, and the rough surfaces 54A, 54B, 53B, which form the remaining surface of the wiring pattern 50B.

Each wiring pattern 50C includes fine wirings that have a small line and space (e.g., L/S=approximately 2 μm/2 μm). In the present example, the wiring pattern 50C includes the metal layer 54, the surface area of which is relatively small. The wiring pattern 50C includes a smooth surface 54C, which forms the entire upper surface of the metal layer 54, a smooth surface 54D, which forms the entire side surface of the metal layer 54, and a smooth surface 53D, which forms the entire side surface of the metal film 53. That is, the entire surface of the wiring pattern 50C is formed by the smooth surfaces. In the wiring pattern 50C, the side surface of the metal film 52 is substantially flush with the smooth surfaces 53D, 54D.

In the wiring patterns 50A to 50C, the entire side surface of the metal film 52 and the entire upper surface of the metal film 52 that is exposed from the metal film 53 and the metal layer 54 are formed by the smooth surfaces having a lower roughness than the rough surfaces 54A.

The rough surfaces 53B, 54A, 54B have a higher surface roughness than the smooth surfaces 53D, 54C, 54D and a lower surface roughness than the wiring layers 22, 23, 42 of the wiring structure 11. The roughness of the rough surfaces 53B, 54A, 54B is set so that the surface roughness Ra value is, for example, approximately 100 to 150 nm. The roughness of the smooth surfaces 53D, 54C, 54D is set so that the surface roughness Ra value is, for example, approximately 1 to 50 nm. As described above, the surface roughness of the wiring layers 22, 23, 42 may be set so that the surface roughness Ra value is, for example, approximately 200 to 1000 nm.

The protective films 55 partially cover the surface of the wiring layer 50. The protective films 55 function to limit occurrence of migration such as electromigration or ion migration, for example, between the wiring layer 50 and the insulation layer 31. Additionally, the protective films 55 function to limit oxidization of, for example, the wiring layer 50. The protective films 55 are conductive. The material of the protective films 55 may be a conductive material that has a higher migration resistance and a higher corrosion resistance than the metal (e.g., Cu) forming the metal film 53 and the metal layer 54. The material of the protective films 55 may be, for example, nickel phosphorus (NiP), nickel tungsten boron (NiWB), or cobalt tungsten phosphorus (CoWP). The thickness of each of the protective films 55 may be, for example, approximately 50 to 300 nm.

The protective films 55 are formed on the surfaces (upper and side surfaces) of the wiring layer 50, which are the smooth surfaces having a low surface roughness. In the present example, the protective films 55 cover the smooth surfaces 53D, 54C, 54D and expose the rough surfaces 53B, 54A, 54B. Additionally, the protective films 55 cover the side surface (smooth surface) of the metal film 52 that is flush with the smooth surfaces 53D, 54D.

In the wiring pattern 50B, the protective film 55 cover, for example, the smooth surface 54C defining a portion of the upper surface of the metal layer 54. The protective film 55 has a larger diameter than the bottom of a via wiring 70V, which connects the wiring layers 50, 70, and functions as a via pad that is connected to the bottom of the via wiring 70V. Additionally, in the wiring pattern 50B, the protective film 55 covers the smooth surface located in the proximity of the wiring patterns 50C including fine wirings. In the wiring pattern 50B of the present example, the protective film 55 covers the entire smooth surface 54C, which forms the upper surface of the metal layer 54, the entire side surface (smooth surface 54D) of the metal layer 54 that is continuous with the smooth surface 54C, the entire side surface (smooth surface 53D) of the metal film 53 that is continuously flush with the smooth surface 54D, and the entire side surface (smooth surface) of the metal film 52 that is continuously flush with the smooth surface 53D. Additionally, the protective films 55 cover the entire surface (upper and side surfaces) of each wiring pattern 50C. In the wiring pattern 50C of the present example, the protective film 55 covers the entire upper surface of the metal layer 54, the entire side surface of the metal layer 54 that is continuous with the upper surface of the metal layer 54, the entire side surface of the metal film 53 that is continuously flush with the side surface of the metal layer 54, and the entire side surface of the metal film 52 that is continuously flush with the side surface of the metal film 53. Thus, the wiring patterns 50B, 50C include boundary surfaces between the smooth surfaces 53D, 54C, 54D and the protective films 55. In the present example, the protective films 55 cover the entire side surface of the metal film 52 that is flush with the smooth surfaces 53D, 54D. Instead, the protective films 55 may cover only a portion of the side surface of the metal film 52. Alternatively, the side surface of the metal film 52 may be exposed.

The rough surfaces 53B, 54A, 54B are free from the protective films 55. Also, the upper and side surfaces of the projection 52T of the metal film 52 exposed from the rough surfaces 53B, 54B are free from the protective films 55. Therefore, the surface of the wiring pattern 50A is free from the protective films 55.

The upper surfaces of the protective films 55 are substantially coplanar with each other. The upper surface of each protective film 55 is formed by a smooth surface 55A, which has a lower roughness than the rough surfaces 54A, 54B. The surface roughness of the smooth surface 55A of the protective film 55 is set to, for example, the same level as the surface roughness of the smooth surface 54C.

The wiring pattern 50B of the wiring layer 50 and the protective film 55 applied to the wiring pattern 50B will now be described further in detail with reference to FIG. 2B.

In the wiring pattern 50B of the wiring layer 50, the rough surface 54A is continuous with the smooth surface 54C. The rough surface 54A is located at a lower position (closer to metal film 53) than the smooth surface 54C. In the present example, the rough surface 54A is downwardly recessed from the smooth surface 54C to expose the lower surface of a peripheral portion of the protective film 55. Thus, the rough surface 54A partially overlaps the peripheral portion of the protective film 55 in a plan view but does not contact the protective film 55. Additionally, the rough surface 54A is sloped up toward the edge of the smooth surface 54C that is in contact with the protective film 55 (i.e., edge of boundary surface of protective film 55 and smooth surface 54C), for example, at a position below the peripheral portion of the protective film 55. Thus, the smooth surface 54C is slightly smaller than the protective film 55 in a plan view. Therefore, the peripheral portion of the protective film 55 outwardly projects from the smooth surface 54C, and the lower surface of the protective film 55 is exposed from the metal layer 54 (wiring layer 50). The protective film 55 has an overhang structure and includes a projection 55T which outwardly projects from the smooth surface 54C. The projection 55T extends throughout the peripheral portion of the protective film 55. In other words, the lower surface of the peripheral portion of the protective film 55 is entirely exposed from the metal layer 54 (wiring layer 50).

From another perspective, a recess 50X is formed in the upper surface of the wiring pattern 50B. The rough surface 54A forms the bottom and side walls of the recess 50X. The recess 50X is downwardly recessed from the smooth surface 54C. The recess 50X extends from the side surface of the protective film 55 toward an inner side of the protective film 55 to expose the lower surface of the peripheral portion of the protective film 55. Thus, the side wall of the recess 50X is located below the protective film 55 and overlapped with the peripheral portion of the protective film 55 in a plan view. Additionally, the side wall of the recess 50X is sloped up toward the edge of the smooth surface 54C that is in contact with the protective film 55. Because of the recess 50X, the smooth surface 54C is slightly smaller than the protective film 55 in a plan view. Additionally, the peripheral portion of the protective film 55 outwardly projects from the smooth surface 54C and is separated from the rough surface 54A.

As illustrated in FIG. 2A, the insulation layer 61 is formed on the upper surface 31A of the insulation layer 31 to cover the wiring layer 50 (wiring patterns 50A to 50C and the protective films 55. The insulation layer 61 is in contact with the rough surfaces 53B, 54A, 54B of the wiring layer 50. This increases the adhesiveness of the wiring layer 50 and the insulation layer 61. Additionally, the recess 50X is filled with the insulation layer 61, which extends under the overhang structure of the protective film 55. The insulation layer 61 covers the upper, lower, and side surfaces of the peripheral portion (i.e., projection 55T) of the protective film 55. In other words, the peripheral portion of the protective film 55 extends into the insulation layer 61. This appropriately limits the separation of the insulation layer 61 from the wiring layer 50 and the protective film 55.

Through holes 61X extend through the insulation layer 61 in the thickness-wise direction at given locations to partially expose the upper surfaces (smooth surfaces 55A) of the protective films 55.

The wiring layer 70 is stacked on the upper surface of the insulation layer 61. The wiring layer 70 is electrically connected to the wiring layer 50. The wiring layer 70 includes via wirings 70V, with which the through holes 61X are filled, and wiring patterns, which are formed on the upper surface of the insulation layer 61 and electrically connected to the wiring layer 50 by the via wirings 70V. The bottom surface of each via wiring 70V is connected to the smooth surface 55A of the corresponding one of the protective films 55. This limits formation of voids in boundary surfaces of the bottom surface of the via wiring 70V and the smooth surface 55A (via pad). The via wiring 70V is electrically connected to the wiring layer 50 (wiring pattern 50B) by the protective film 55.

The wiring layer 70 includes a seed layer 71 having a two-layer structure in which a metal film 73 is stacked on a metal film 72 to cover the upper surface of the metal film 72. The metal film 72 continuously covers wall surfaces defining each through hole 61X (wall surface defining through hole 61X and smooth surface 55A of protective film 55 exposed in bottom of through hole 61X) and the upper surface of the insulation layer 61. The wiring layer 70 further includes a metal layer 74, which covers the upper surface of the seed layer 71 (metal film 73). The materials of the metal films 72, 73 and the metal layer 74 may be, for example, the same as the materials of the metal films 52, 53 and the metal layer 54, respectively.

The wiring layer 70 includes wiring patterns 70A to 70C, which are formed in the same manner as the wiring patterns 50A to 50C. Each wiring pattern 70A includes a rough surface 74A, which forms the upper surface of the metal layer 74, a rough surface 73B, which forms the entire side surface of the metal film 73, and a rough surface 74B, which forms the entire side surface of the metal layer 74. Additionally, in the wiring pattern 70A, the metal film 72 includes a projection 72T which outwardly projects from the rough surfaces 73B, 74B. The projection 72T defines an edge portion of the metal film 72. Each wiring pattern 70B includes a smooth surface 74C, which forms a portion of the upper surface of the metal layer 74, and a rough surface 74A, which forms the upper surface of the metal layer 74 excluding the smooth surface 74C. In the wiring pattern 70B, the rough surface 74A is continuous with the smooth surface 74C and located below the smooth surface 74C. A recess 70X is formed in the upper surface of the metal layer 74. Each wiring pattern 70C includes a smooth surface 73D, which forms the entire surface of the metal film 73, and smooth surfaces 74C, 74D, which form the entire surface of the metal layer 74.

The protective films 75 cover a portion of the wiring layer 70. In the present example, the protective films 75 cover the smooth surfaces 73D, 74C, 74D. In each wiring pattern 70B, the protective film 75 includes a peripheral portion (projection), which outwardly projects from the smooth surface 74C, and has an overhang structure in which the lower surface of the protective film 75 is exposed from the metal layer 74 (wiring layer 70). The upper surface of the protective film 75 is formed by a smooth surface 75A, which has a lower roughness than the rough surface 74A.

The insulation layer 63 is formed on the upper surface of the insulation layer 61 to cover the wiring layer 70 (wiring patterns 70A to 70C) and the protective films 75. The insulation layer 63 covers the upper, lower, and side surfaces of the peripheral portions of the protective films 75. Through holes 63X extend through the insulation layer 63 in the thickness-wise direction at given locations to partially expose the smooth surfaces 75A of the protective films 75.

The wiring layer 80 is stacked on the upper surface of the insulation layer 63. The wiring layer 80 is electrically connected to the wiring layer 70. The wiring layer 80 includes via wirings, with which the through holes 63X are filled, and wiring patterns, which are formed on the upper surface of the insulation layer 63. The bottom surface of each via wiring, with which the through hole 63X is filled, is in contact with the smooth surface 75A of the corresponding one of the protective films 75 and electrically connected to the wiring layer 70 by the protective film 75.

The wiring layer 80 includes a seed layer 81 having a two-layer structure in which a metal film 83 is stacked on a metal film 82 to cover the upper surface of the metal film 82. The metal film 82 continuously covers wall surfaces defining the through holes 63X and the upper surface of the insulation layer 63. The wiring layer 80 further includes a metal layer 84, which covers the upper surface of the seed layer 81 (metal film 83). The materials of the metal films 82, 83 and the metal layer 84 may be, for example, the same as the materials of the metal films 52, 53 and the metal layer 54, respectively.

The wiring layer 80 includes wiring patterns 80A to 80C, which are formed in the same manner as the wiring patterns 50A to 50C. Each wiring pattern 80A includes a rough surface 84A, which forms the upper surface of the metal layer 84, a rough surface 83B, which forms the entire side surface of the metal film 83, and a rough surface 84B, which forms the entire side surface of the metal layer 84. Additionally, in the wiring pattern 80A, the metal film 82 includes a projection 82T which outwardly projects from the rough surfaces 83B, 84B. The projection 82T defines an edge portion of the metal film 82. Each wiring pattern 80B includes a smooth surface 84C, which forms a portion of the upper surface of the metal layer 84, and a rough surface 84A, which forms the upper surface of the metal layer 84 excluding the smooth surface 84C. In the wiring pattern 80B, the rough surface 84A is continuous with the smooth surface 84C and located below the smooth surface 84C. A recess 80X is formed in the upper surface of the metal layer 84. Each wiring pattern 80C includes a smooth surface 83D, which forms the entire surface of the metal film 83, and smooth surfaces 84C, 84D, which form the entire surface of the metal layer 84.

The protective films 85 cover a portion of the wiring layer 80. In the present example, the protective films 85 cover the smooth surfaces 83D, 84C, 84D. In each wiring pattern 80B, the protective film 85 includes a peripheral portion (projection), which outwardly projects from the smooth surface 84C, and has an overhang structure in which the lower surface of the protective film 85 is exposed from the metal layer 84 (wiring layer 80). The upper surface of the protective film 85 is formed by a smooth surface 85A, which has a lower roughness than the rough surface 84A.

The insulation layer 65 is formed on the upper surface of the insulation layer 63 to cover the wiring layer 80 (wiring patterns 80A to 80C) and the protective films 85. The insulation layer 65 covers the upper, lower, and side surfaces of the peripheral portions of the protective films 85. Through holes 65X extend through the insulation layer 65 in the thickness-wise direction at given locations to partially expose the smooth surfaces 85A of the protective films 85.

Each of the through holes 61X, 63X, 65X is tapered so that the diameter is decreased from the upper side toward the lower side (side close to insulation layer 31) in FIG. 2A. Each of the through holes 61X, 63X, 65X is shaped, for example, as an inverted truncated cone so that the upper open end has a larger diameter than the lower open end. The upper open end of each of the through holes 61X, 63X, 65X may, for example, have a diameter of approximately 10 to 20 μm.

The wiring layer 90 is stacked on the upper surface of the insulation layer 65. The wiring layer 90 is electrically connected to the wiring layer 80. The wiring layer 90 includes via wirings, with which the through holes 65X are filled, and pads P1, which project from the upper surface of the insulation layer 65. The bottom surface of each via wiring, with which the through hole 65X is filled, is in contact with the smooth surface 85A of the corresponding one of the protective films 85 and electrically connected to the wiring layer 80 by the protective film 85.

The wiring layer 90 includes a seed layer 91 having a two-layer structure in which a metal film 93 is stacked on a metal film 92 to cover the upper surface of the metal film 92. The metal film 92 continuously covers wall surfaces defining the through holes 65X and the upper surface of the insulation layer 65 located in the vicinity of the through holes 65X. Additionally, the wiring layer 90 includes a metal layer 94, which covers the upper surface of the seed layer 91 (metal film 93). The materials of the metal films 92, 93 and the metal layer 94 may be, for example, the same as the materials of the metal films 52, 53 and the metal layer 54, respectively.

Each pad P1 may have any planar shape and any size. The planar shape of the pad P1 may be, for example, a circle having a diameter of approximately 20 to 30 μm. The pitch of the pads P1 may be, for example, approximately 40 to 60 μm. The pads P1 function as electronic component mount pads, which are electrically connected to an electronic component such as a semiconductor chip.

If necessary, a surface-processed layer may be formed on the surfaces (upper and side surfaces or only upper surface) of the pad P1. Examples of the surface-processed layer include a gold (Au) layer, a nickel (Ni) layer/Au layer (metal layer in which Ni layer serves as bottom layer and Au layer is stacked on Ni layer), and an Ni layer/palladium (Pd) layer/Au layer (metal layer in which Ni layer serves as bottom layer and Ni layer, Pd layer, and Au layer are sequentially stacked). Each of the Ni layer, the Au layer, and the Pd layer may be, for example, an electroless plating metal layer formed through an electroless plating process. The Ni layer is a metal layer of Ni or an Ni alloy. The Au layer is a metal layer of Au or an Au alloy. The Pd layer is a metal layer of Pd or a Pd alloy. The surface-processed layer may be formed by performing an anti-oxidization process such as an organic solderability preservative (OSP) process on the surface (upper and side surfaces or only upper surface) of the pad P1.

As illustrated in FIG. 1, the solder resist layer 13 is the outermost insulation layer (here, lowermost insulation layer) of the wiring substrate 10. The solder resist layer 13 is formed on the lower surface of the wiring structure 11 (here, lower surface 41B of lowermost insulation layer 41 of wiring structure 11) to cover the lowermost wiring layer 42.

The solder resist layer 13 includes openings 13X, which partially expose the lowermost wiring layer 42 as external connection pads P2. The external connection pads P2 are connected to external connection terminals such as solder balls or lead pins that are used to mount the wiring substrate 10 to a mount board such as a motherboard. If necessary, a surface-processed layer may be formed on the wiring layer 42 exposed from the openings 13X. Examples of the surface-processed layer include an Au layer, an Ni/Au layer, an Ni layer/Pd layer/Au layer. The surface-processed layer may be formed by performing an anti-oxidization process such as an OSP process on the lower surfaces of the external connection pads P2. The wiring layer 42 exposed from the openings 13X may be used as the external connection terminals. Alternatively, when a surface-processed layer is formed on the wiring layer 42, the surface-processed layer may be used as the external connection terminals.

Each of the external connection pads P2 and the openings 13X may have any planar shape and any size. The planar shape of each of the external connection pads P2 and the openings 13X may be, for example, a circle having a diameter of approximately 200 to 300 μm. The material of the solder resist layer 13 may be a photosensitive insulative resin, the main component of which is, for example, a phenol resin or a polyimide resin. Alternatively, the material of the solder resist layer 13 may be a photosensitive insulative resin, the main component of which is, for example, a silicone resin, an epoxy resin, a cycloolefin resin, or a benzocyclobutene resin. The solder resist layer 13 may contain, for example, a filler such as silica or alumina.

Figure 3:
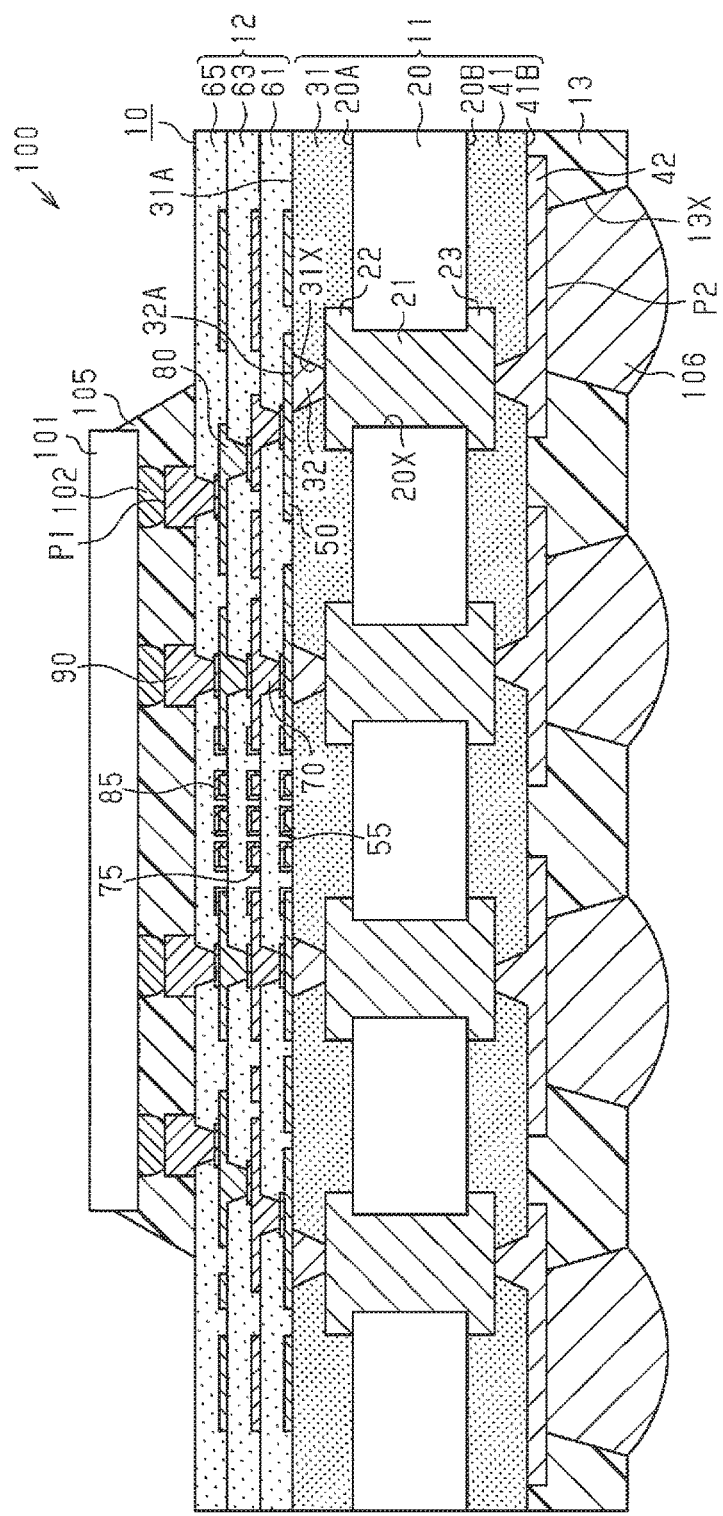
FIG. 3 is a schematic cross-sectional view of a semiconductor device that includes the wiring substrate of FIG. 1.

A semiconductor device 100 will now be described with reference to FIG. 3.

The semiconductor device 100 includes the wiring substrate 10, at least one semiconductor chip 101, an underfill resin 105, and external connection terminals 106.

The semiconductor chip 101 is flip-chip-mounted on the wiring substrate 10. In the present example, the semiconductor chip 101 includes a circuit formation surface (here, lower surface) on which bumps 102 are arranged. The bumps 102 are bonded to the pads P1 of the wiring substrate 10 to electrically connect the semiconductor chip 101 to the wiring layer 90.

The semiconductor chip 101 may be, for example, a logic chip such as a central processing unit (CPU) chip or a graphics processing unit (GPU) chip. Alternatively, the semiconductor chip 101 may be, for example, a memory chip such as a dynamic random access memory (DRAM) chip, a static random access memory (SRAM) chip, or a flash memory chip. A plurality of semiconductor chips 101 having the combination of a logic chip and a memory chip may be mounted on the wiring substrate 10.

The bumps 102 may be, for example, gold bumps or solder bumps. The material of the solder bumps may be, for example, an alloy containing lead (Pb); an alloy of tin (Sn) and Au; an alloy of Sn and Cu; an alloy of Sn and silver (Ag); or an alloy of Sn, Ag, and Cu.

The gap between the wiring substrate 10 and the semiconductor chip 101 is filled with the underfill resin 105. The material of the underfill resin 105 may be, for example, an insulative resin such as an epoxy resin.

The external connection terminals 106 are formed on the external connection pads P2 of the wiring substrate 10. The external connection terminals 106 are electrically connected to pads arranged on the mount board such as a motherboard (not illustrated). The external connection terminals 106 may be, for example, solder balls or lead pins. In the present example, solder balls are used as the external connection terminals 106.

A method for manufacturing the wiring substrate 10 will now be described. Here, a batch manufacturing method, in which after a batch of wiring substrates 10 is simultaneously manufactured in a large substrate, the large substrate is singulated into a plurality of wiring substrates 10, will be described below.

In the step of FIG. 4A, a structural body that includes the core substrate 20, the through electrodes 21, and the wiring layers 22, 23 is prepared through a known manufacturing process. A large substrate that is capable of manufacturing a plurality of wiring substrates 10 is used as the core substrate 20. The core substrate 20 includes, for example, a plurality of regions A1. The structural body corresponding to the wiring substrate 10 is formed in each region A1. After the structural body of the wiring substrate 10 is formed in each region A1, the core substrate 20 is cut with a slicer or the like along cutting lines A2. This singulates the core substrate 20 into a plurality of wiring substrates 10.

In the step of FIG. 4A, a roughening process is performed on the wiring layers 22, 23. For example, blackening, etching, plating, or blasting may be performed as the roughening process.

In the step of FIG. 4B, the insulation layer 31 is formed to cover the upper surface 20A of the core substrate 20 and the wiring layer 22. Also, the insulation layer 41 is formed to cover the lower surface 20B of the core substrate 20 and the wiring layer 23.

In the step of FIG. 4C, the through holes 31X are formed in given locations of the insulation layer 31 to partially expose the upper surface of the wiring layer 22. Also, the through holes 41X are formed in given locations of the insulation layer 41 to partially expose the lower surface of the wiring layer 23. The through holes 31X, 41X may be formed, for example, through laser drilling using a $CO_2$ laser or a UV-YAG laser. When the through holes 31X, 41X are formed through laser drilling, a desmear process is performed to remove resin smears from exposed surfaces of the wiring layers 22, 23, which are exposed in the bottoms of the through holes 31X, 41X. The desmear process roughens wall surfaces defining the through holes 31X, the upper surface 31A of the insulation layer 31, wall surfaces defining the through holes 41X, and the lower surface 41B of the insulation layer 41.

In the step of FIG. 5A, the wiring layer 42 is formed. The wiring layer 42 includes via wirings, with which the through holes 41X of the insulation layer 41 are filled, wiring patterns, which are stacked on the lower surface 41B of the insulation layer 41. The wiring layer 42 may be formed, for example, through various kinds of wiring formation processes such as a semi-additive process and a subtractive process.

Additionally, in the step of FIG. 5A, a seed layer (not illustrated) is formed to cover the entire surface of the insulation layer 31 including the wall surfaces of the through holes 31X and the entire upper surface of the wiring layer 22 exposed from the through holes 31X. Then, electrolytic plating is performed using the seed layer as the power feeding layer. For example, the seed layer is formed through electroless copper plating. Then, electrolytic copper plating is performed using the seed layer as the power feeding layer. This forms a conductive layer 110, with which the through holes 31X are filled, covering the entire upper surface 31A of the insulation layer 31.

Subsequently, for example, chemical mechanical polishing (CMP) is performed to polish the conductive layer 110 that projects from the upper surface 31A of the insulation layer 31. Additionally, the rough surface that forms a portion of the upper surface 31A of the insulation layer 31 is polished. Consequently, as illustrated in FIG. 5B, the through holes 31X are filled with the via wirings 32. The upper end surfaces 32A of the via wirings 32 are substantially flush with the upper surface 31A of the insulation layer 31. The polishing of the portion of the upper surface 31A of the insulation layer 31 smooths the upper surface 31A of the insulation layer 31. The polishing step obtains polished surfaces defining the upper surface 31A of the insulation layer 31 and the upper end surfaces 32A of the via wirings 32. The above manufacturing steps manufacture the structural body of the wiring structure 11 in each region A1.

In the step of FIG. 6A, the seed layer 51 is formed to cover the entire upper surface 31A of the insulation layer 31 and the entire upper end surfaces 32A of the via wirings 32. The seed layer 51 may be formed, for example, through sputtering.

In the present example, as illustrated in FIG. 6B, sputtering is performed to deposit titanium on the upper surface 31A of the insulation layer 31 and the upper end surfaces 32A of the via wirings 32 to form the metal film 52. Then, sputtering is performed to deposit copper on the metal film 52 to form the metal film 53. This forms the seed layer 51 having the two-layer structure (metal film 52 and metal film 53).

Figure 7A:
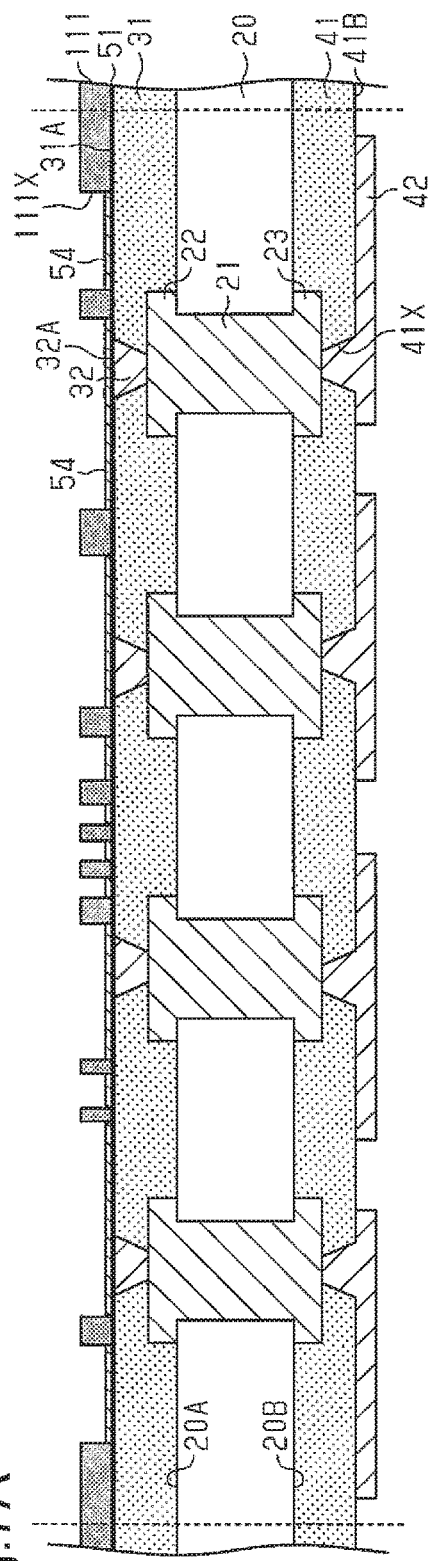

In the step of FIG. 7A, a resist layer 111 that includes opening patterns 111X in given locations is formed on the seed layer 51. The opening patterns 111X expose the seed layer 51 at portions corresponding to the region where the wiring layer 50 (refer to FIG. 1) is formed. For example, a material that is resistant to the plating performed in the next step may be used as the material of the resist layer 111. For example, a photosensitive dry film resist or a liquid photoresist may be used as the resist layer 111. For example, a novolac resin or an acrylic resin may be used as such a resist material. For example, when a photosensitive dry film resist is used, the upper surface of the seed layer 51 is laminated with a dry film through thermocompression. The dry film is patterned through photolithography to form the resist layer 111 including the opening patterns 111X. When a liquid photoresist is used, the resist layer 111 may also be formed through the same steps.

Figure 7B:
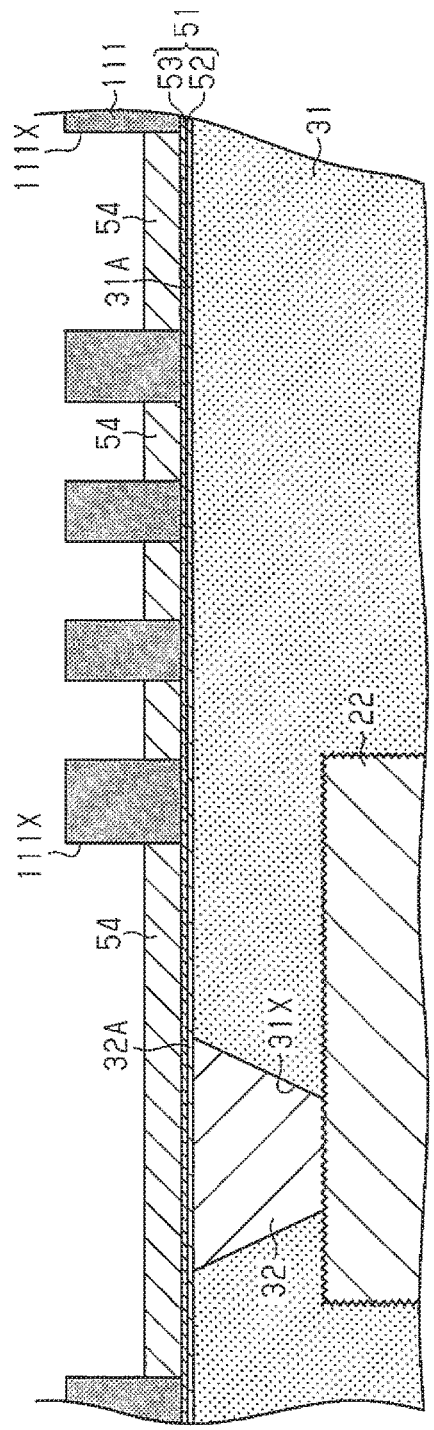

Then, electrolytic plating (here, electrolytic copper plating) is performed using the resist layer 111 as the plating mask and the seed layer 51 as the plating power feeding layer. The electrolytic plating forms the metal layer 54 (electrolytic plating metal layer) on the upper surface of the seed layer 51 that is exposed from the opening patterns 111X in the resist layer 111. As a result, as illustrated in FIG. 7B, the seed layer 51, which has the two-layer structure including the metal films 52, 53, and the metal layer 54, which is exposed from the opening patterns 111X in the resist layer 111, are sequentially stacked on the upper surface 31A of the insulation layer 31.

In the step of FIG. 8A, the resist layer 111 is removed, for example, by an alkaline stripping solution. The unnecessary portion of the metal film 53 is removed through etching using the metal layer 54 as the etching mask. For example, an ammonium persulfate solution or a solution of the mixture of hydrogen peroxide and sulfuric acid may be used as the etchant that etches the metal film 53. Then, the unnecessary portion of the metal film 52 (here, Ti film) is removed through etching using the metal layer 54 and the metal film 53 (here, Cu film), which remains after the etching, as the etching masks. Examples of etching of the metal film 52 include dry etching that uses a mixture gas in which $O_2$ and $N_2$ is added to $CF_4$ or wet etching that uses a solution of the mixture of hydrogen peroxide and sulfuric acid as the etchant. As illustrated in FIG. 8A, the removal processes form the wiring layer 50 on the upper end surface 32A of the via wiring 32 and the upper surface 31A of the insulation layer 31. As described above, the wiring layer 50 is formed through a semi-additive process. The wiring layer 50 includes the seed layer 51 and the metal layer 54, which is formed on the seed layer 51. The seed layer 51 includes the metal film 52, which is stacked on the upper end surface 32A of the via wiring 32 and the upper surface 31A of the insulation layer 31, and the metal film 53, which is stacked on the metal film 52. In the present example, the wiring layer 50 includes the wiring patterns 50A, 50B, each of which has a relatively large surface area, and the wiring patterns 50C, each of which has a relatively small surface area and includes fine wiring. In the wiring layer 50 (wiring patterns 50A to 50C), the side surface of the metal film 52, the side surface of the metal film 53, and the side surface of the metal layer 54 are substantially flush with each other.

In the step of FIG. 8B, a resist layer 112 that includes opening patterns 112X in given locations is formed on the upper surface 31A of the insulation layer 31. The opening patterns 112X expose the surfaces of the wiring layer 50 and the upper surface 31A of the insulation layer 31 at portions corresponding to the regions where the protective films 55 (refer to FIG. 2A) are formed. The opening patterns 112X expose, for example, a portion of the upper surface of the wiring pattern 50B and the side surface of the wiring pattern 50B that is continuous with the portion of the upper surface. Additionally, the opening patterns 112X expose the remaining upper surface of the wiring pattern 50B and the entire surface (upper and side surfaces) of each wiring pattern 50C. The resist layer 112 covers the surface of the wiring layer 50 and the upper surface 31A of the insulation layer 31 excluding the formation regions of the protective films 55 (refer to FIG. 2A). The resist layer 112 covers, for example, the entire surface of the wiring pattern 50A.

A photosensitive dry film resist or a liquid photoresist may be used as the resist layer 112. For example, a novolac resin or an acrylic resin may be used as such a resist material. The resist layer 112 may be formed, for example, through the same process as the resist layer 111 (refer to FIG. 7B).

In the step of FIG. 9A, the protective films 55 are formed to cover the entire upper surface and the entire side surface of the wiring layer 50 that are exposed from the resist layer 112. The roughening process is not performed on the exposed surfaces of the wiring layer 50. Thus, the exposed surfaces of the wiring layer 50 are formed by smooth surfaces having a low surface roughness. The protective films 55 are formed along the smooth surfaces (upper and side surfaces) of the wiring layer 50. This forms the smooth surfaces 55A, which form the upper surfaces of the protective films 55 and have low roughness that are substantially the same as the roughness of the smooth surface of the wiring layer 50.

The protective films 55 may be formed, for example, through an electroless plating process. The electroless plating process forms the protective films 55 only on the surfaces of metal layers (here, metal films 52, 53 and metal layer 54). Thus, when the protective films 55 are formed through the electroless plating process, the protective films 55 do not adhere to the upper surface 31A of the insulation layer 31. Additionally, when the metal film 52 is formed from Ti or the like, the protective films 55 may not be formed on the side surfaces of the metal film 52 or may be formed on only a portion of the side surfaces of the metal film 52. The protective films 55 may also be formed, for example, through sputtering or vapor deposition.

In the step of FIG. 9B, the resist layer 112, which is illustrated in FIG. 9A, is removed, for example, by an alkaline stripping solution.

In the step of FIG. 10A, a roughening process is selectively performed on the metal film 53 and the metal layer (Cu layer) using the protective films 55 as the mask whereas the roughness process is not performed on the metal film 52. The roughening process forms the rough surface 53B, which forms the entire side surface of the metal film 53 of the wiring layer 50 exposed from the protective films 55, and the rough surfaces 54A, 54B, which form the entire upper surface and the entire side surface of the metal layer 54 that are exposed from the protective films 55. In this step, the surface of the wiring layer 50 covered by the protective films 55 (portion of wiring pattern 50B and wiring patterns 50C) is not roughened and maintained as the smooth surface. The smooth surface 54C is partially maintained, for example, on the upper surface of the wiring pattern 50B. Additionally, the smooth surface 54D is maintained, for example, on the entire side surface of the metal layer 54 that is continuous with the portion of the upper surface of the wiring pattern 50B formed by the smooth surface 54C. Also, the smooth surface 53D is maintained on the entire side surface of the metal film 53 that is continuous with the smooth surface 54D. Additionally, the smooth surface 53D is maintained, for example, on the entire side surface of the metal film 53 of each wiring pattern 50C. The smooth surfaces 54C, 54D are maintained on the entire upper surface and the entire side surface of the metal layer 54 of the wiring pattern 50C. The protective films 55 are formed on these smooth surfaces of the wiring patterns 50B, 50C.

In the step of FIG. 10A, the roughening process partially removes the surfaces of the metal film 53 and the metal layer 54. Thus, the rough surface 54A is downwardly recessed from the smooth surface 54C. Consequently, as illustrated in FIG. 10B, the recess 50X is formed in the upper surface of the wiring layer 50. The wall surface of the recess 50X is formed by the rough surface 54A.

The roughening process is performed so that the side wall surfaces of the recess 50X are located closer to an inner side of the protective film 55 than the side surfaces of the protective film 55. Thus, the protective film 55 has the overhang structure, in which the lower surface of the peripheral portion of the protective film 55 is exposed from the metal layer 54 (wiring layer 50). Such an overhang structure may be formed, for example, through isotropic etching using the protective film 55 as the etching mask. For example, when the roughening process is performed through isotropic etching, the masking effect of the protective film 55 results in side etching and undercutting, which form the side wall surfaces of the recess 50X located toward the inner side of the protective film 55. Thus, the peripheral portion of the protective film 55 is formed as the projection 55T, which outwardly projects from the smooth surface 54C.

Additionally, the roughening process is performed, for example, to selectively roughen the metal film 53 and the metal layer 54 whereas the metal film 52 is not roughened. The metal film 53 and the metal layer 54 (e.g., Cu layer) may be etched without roughening the surface of the metal film 52 (e.g., Ti film), for example, by setting conditions such as the etchant. The roughening process does not affect the metal film 52. The surface of the metal film 52 will not be roughened. As a result, when the roughening process partially etches the metal film 53 and the metal layer 54, the metal film 53 and the metal layer 54 become smaller than the metal film 52 in a plan view. The edge portion of the metal film 52 outwardly projects from the metal film 53 and the metal layer 54. As described above, the roughening process, which is performed on the metal film 53 and the metal layer 54, forms the edge portion of the metal film 52 as the projection 52T outwardly projecting from the metal film 53 and the metal layer 54.

In the step illustrated in FIGS. 10A and 10B, for example, a ferric chloride solution, a cupric chloride aqueous solution, an ammonium persulfate solution, or an ammonium copper chloride solution may be used as the etchant that is used in the roughening process (isotropic etching).

In the step of FIGS. 11A and 11B, the insulation layer 61 that includes the through holes 61X, which partially expose the upper surfaces (smooth surfaces 55A) of the protective films 55, is formed on the upper surface 31A of the insulation layer 31. At this time, as illustrated in FIG. 11B, the insulation layer 61 covers the upper, lower, and side surfaces of the projection 55T (peripheral portion) of the protective film 55. This appropriately limits the separation of the insulation layer 61 from the wiring layer 50. Additionally, the surface of the wiring layer 50 is partially formed by the rough surfaces 53B, 54A, 54B. This increases the adhesiveness of the insulation layer 61 and the wiring layer 50 as compared to when the entire surface of the wiring layer 50 is formed by a smooth surface.

For example, when a resin film is used as the insulation layer 61, the upper surface 31A of the insulation layer 31 is laminated with the resin film through thermocompression. The resin film is patterned through photolithography to form the insulation layer 61. For example, a photosensitive resin film of a phenol resin or a polyimide resin may be used as the resin film. Alternatively, when a liquid insulative resin or an insulative resin paste is used as the insulation layer 61, the liquid insulative resin or the insulative resin paste is applied, for example, to the upper surface 31A of the insulation layer 31 through spin coating or the like. The insulative resin is patterned through photolithography to form the insulation layer 61. For example, a photosensitive resin such as a phenol resin or a polyimide resin may be used as the liquid insulative resin or the insulative resin paste.

The roughness of the upper surface of the insulation layer 61, which is formed from such a photosensitive resin, may be set so that the surface roughness Ra value is, for example, approximately 2 to 10 nm. Thus, the surface roughness of the upper surface of the insulation layer 61 is lower than that of the wall surfaces of the through holes 31X. Additionally, the surface roughness of the upper surface of the insulation layer 61 is lower than that of the upper surface 31A of the insulation layer 31 (polished surface).

In the step of FIGS. 12A and 12B, a semi-additive process is performed to form the wiring layer 70, for example, through the same steps as illustrated in FIGS. 6A to 8A. The wiring layer 70 includes the via wirings 70V, with which the through holes 61X are filled, and the wiring patterns, which are electrically connected to the wiring layer 50 by the via wirings 70V and stacked on the upper surface of the insulation layer 61. As illustrated in FIG. 12B, the wiring layer 70 includes the seed layer 71, which has the two-layer structure in which the metal film 72 and the metal film 73 are sequentially stacked, and the metal layer 74 (electrolytic copper plating layer), which is formed on the seed layer 71. The bottom surface of each via wiring 70V is formed on the smooth surface 55A of the protective film 55 that is exposed in the bottom of the through hole 61X. That is, the smooth surface 55A forms the via pad for each via wiring 70V. Thus, as compared to when via pads are formed by rough surfaces, the formation of voids is appropriately limited in the boundary surface of the metal film 52, which is located in the lowermost layer of the via wiring 70V, and the smooth surface 55A (via pad).

Figure 13:
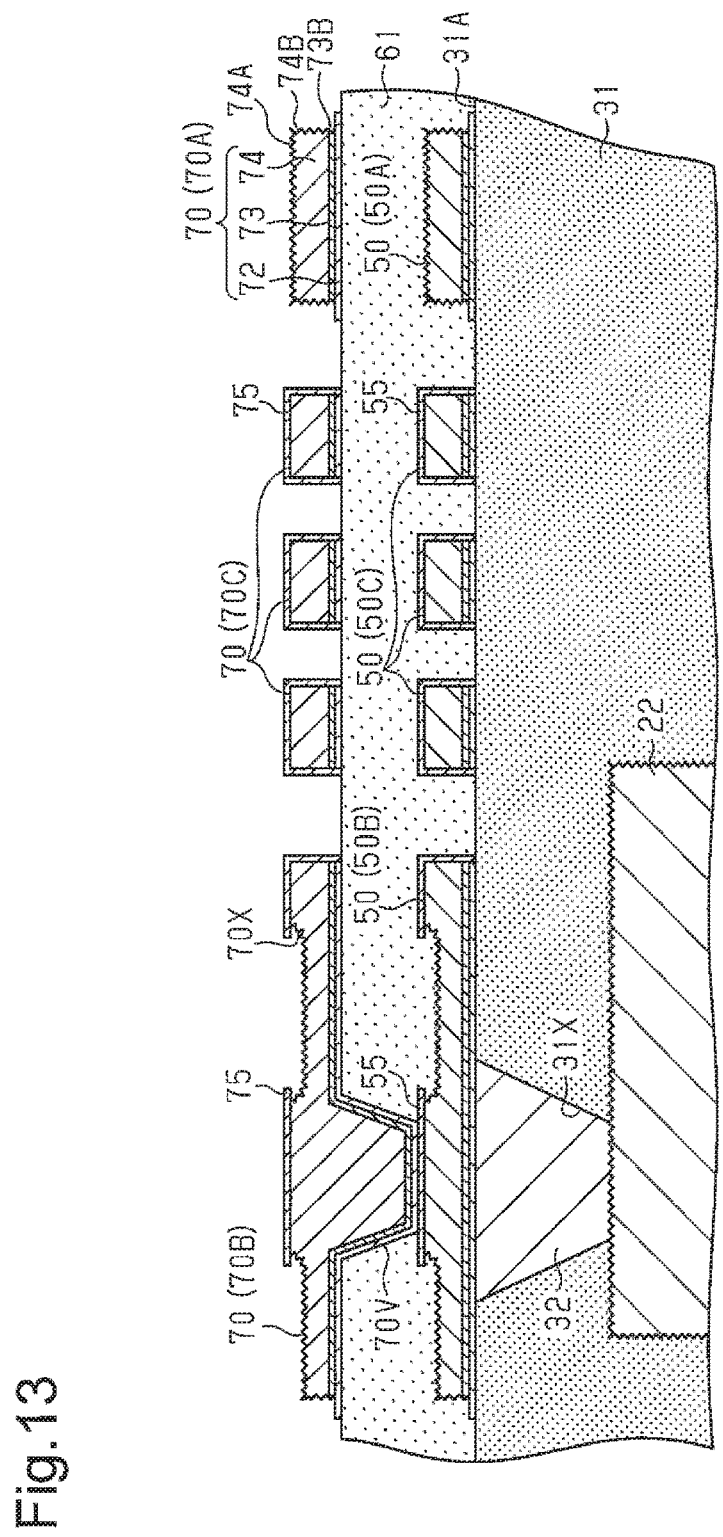

In the step of FIG. 13, the protective films 75 are partially formed on the surfaces of the wiring layer 70 by performing the same steps as illustrated in FIGS. 8B to 10B. The roughening process is selectively performed on the metal film 73 and the metal layer 74 of the wiring layer 70 using the protective films 75 as the mask. The roughening process forms the rough surface 73B, which forms the side surface of the metal film 73 exposed from the protective films 75, and the rough surfaces 74A, 74B, which form the upper and lower surfaces of the metal layer 74 exposed from the protective films 75. When the surfaces of the metal film 73 and the metal layer 74 are roughened through the roughening process, the recess 70X is formed in the upper surface of the wiring layer 70 (metal layer 74). The rough surface 74A forms the wall surface of the recess 70X. The roughening process forms the protective film 75 having an overhang structure in which the lower surface of the peripheral portion of the protective film 75 is exposed from the metal layer 74 (wiring layer 70).

Figure 14:
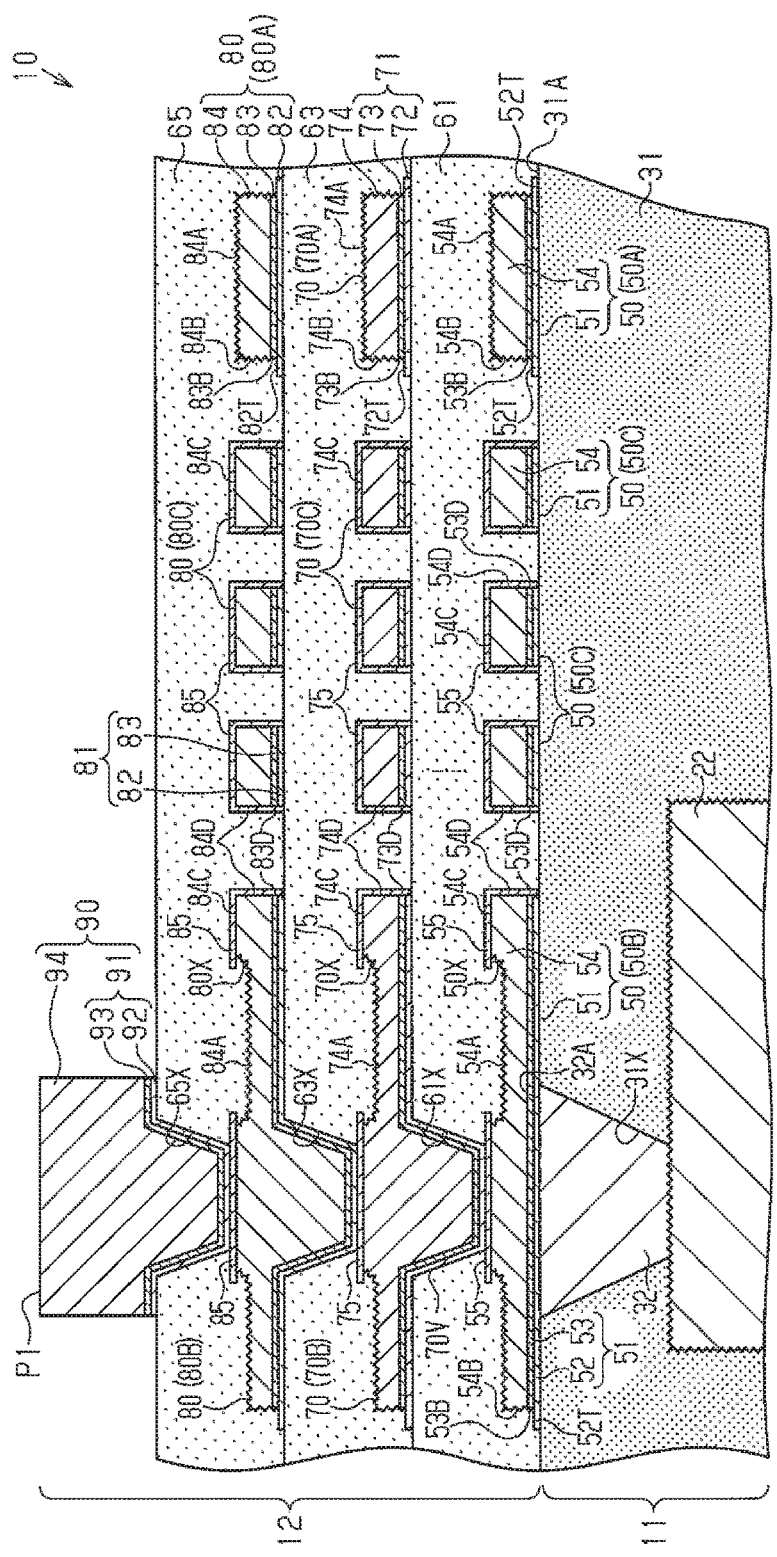

In the step of FIG. 14, the insulation layer 63 including the through hole 63X, which partially exposes the upper surface of the protective film 75, is formed on the insulation layer 61 by performing the same step as illustrated in FIGS. 11A and 11B. The insulation layer 63 covers the upper, lower, and side surfaces of the peripheral portion of the protective film 75.

The wiring layer 80 is formed, for example, through the semi-additive process by performing the same steps as illustrated in FIGS. 6A to 8A. The wiring layer 80 includes the via wiring, with which the through hole 63X is filled, and the wiring patterns, which are electrically connected to the wiring layer 70 by the via wiring and stacked on the upper surface of the insulation layer 63. The wiring layer 80 includes the seed layer 81, which has the two-layer structure in which the metal film 82 and the metal film 83 are sequentially stacked, and the metal layer 84 (electrolytic copper plating layer), which is formed on the seed layer 81.

The protective films 85 are partially formed on the surface of the wiring layer 80 by performing the same steps as illustrated in FIGS. 8B to 10B. The roughening process is selectively performed on the metal film 83 and the metal layer 84 of the wiring layer 80 using the protective films 85 as the mask. The roughening process forms the rough surfaces 83B, which form the side surfaces of the metal film 83 exposed from the protective films 85, and the rough surfaces 84A, 84B, which form the upper and side surfaces of the metal layer 84 exposed from the protective films 85. Additionally, when the surfaces of the metal film 83 and the metal layer 84 are roughened through the roughening process, the recess 80X is formed in the upper surface of the wiring layer 80 (metal layer 84). The rough surface 84A forms the wall surface of the recess 80X. The roughening process forms the protective film 85 having an overhang structure in which the lower surface of the peripheral portion of the protective film 85 is exposed from the metal layer 84 (wiring layer 80).

The insulation layer 65 including the through hole 65X, which partially exposes the upper surface of the protective film 85, is formed on the insulation layer 63 by performing the same step as illustrated in FIGS. 11A and 11B. The insulation layer 65 covers the upper, lower, and side surfaces of the peripheral portion of the protective film 85. The wiring layer 90 is formed, for example, through a semi-additive process by performing the same steps as illustrated in FIGS. 6A to 8A. The wiring layer 90 includes the via wirings, with which the through holes 65X are filled, and the pads P1, which are electrically connected to the wiring layer 80 by the via wirings and stacked on the upper surface of the insulation layer 65. The wiring layer 90 includes the seed layer 91, which has the two-layer structure in which the metal film 92 and the metal film 93 are sequentially stacked, and the metal layer 94 (electrolytic copper plating layer), which is formed on the seed layer 91. If necessary, a surface-processed layer may be formed on the surfaces of the pads P1 of the wiring layer 90.

The above manufacturing steps stack the wiring structure 12 on the upper surface 31A of the insulation layer 31, which defines the uppermost layer of the wiring structure 11.

Figure 15:
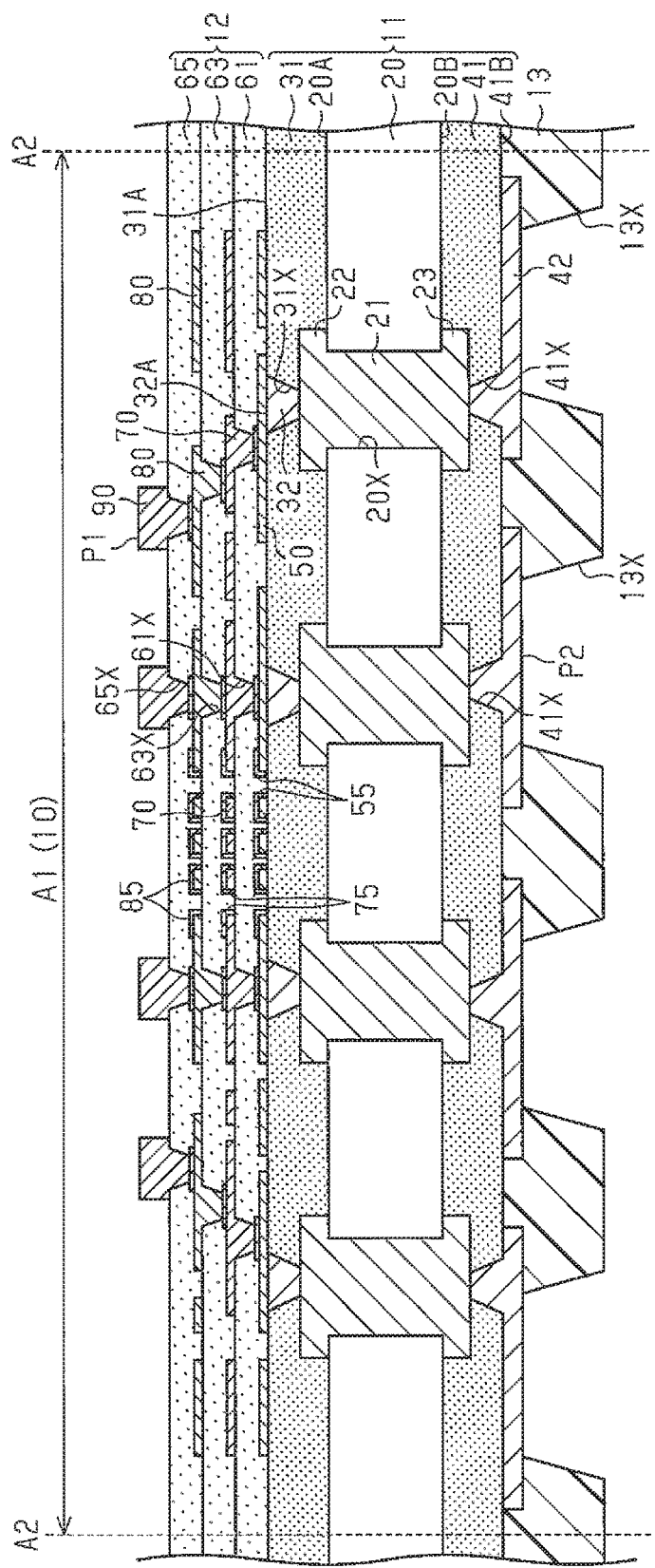

In the step of FIG. 15, the solder resist layer 13 is stacked on the lower surface 41B of the insulation layer 41. The solder resist layer 13 includes the openings 13X that expose the wiring layer 42, which defines the lowermost layer of the wiring structure 11, as the external connection pads P2. The solder resist layer 13 may be formed, for example, by laminating a photosensitive solder resist film or applying a liquid solder resist and patterning the resist into a desired shape.

If necessary, a surface-processed layer may be formed on the external connection pads P2. The solder resist layer 13 may be formed any time after the lowermost wiring layer 42 is formed. For example, the solder resist layer 13 may be formed after the step of FIG. 5A. The above manufacturing steps manufacture the structural body of the wiring substrate 10 in each region A1.

As illustrated in FIG. 15, the structural body is cut along the cutting lines A2 with a slicer or the like to obtain a plurality of singulated wiring substrates 10.

A method for manufacturing the semiconductor device 100 will now be described.

Figure 16:
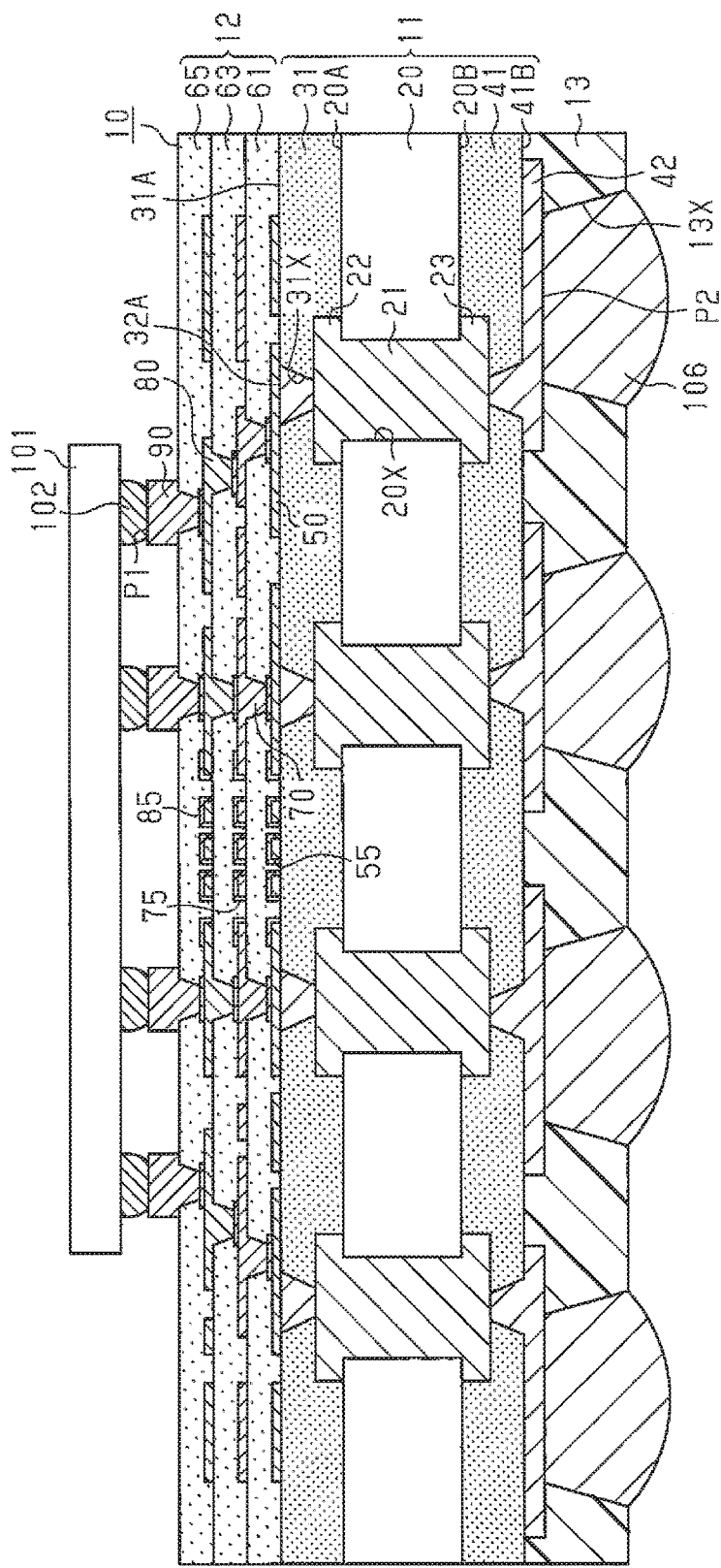
FIG. 16 is a schematic cross-sectional view illustrating a method for manufacturing the semiconductor device of FIG. 3.

In the step of FIG. 16, the external connection terminals 106 are formed on the external connection pads P2. For example, after a flux is appropriately applied to the external connection pads P2, the external connection terminals 106 (here, solder balls) are mounted and reflowed at a temperature of approximately 240° C. to 260° C. to fix the external connection terminals 106 to the external connection pads P2. Subsequently, the flux is removed through a surface cleaning process.

Additionally, in the step of FIG. 16, the semiconductor chip 101 is mounted on the wiring substrate 10. In the present example, the bumps 102 of the semiconductor chip 101 are flip-chip-bonded to the pads P1 of the wiring substrate 10. The gap between the semiconductor chip 101 and the wiring substrate 10, which are flip-chip-bonded to each other, is filled with the underfill resin 105 (refer to FIG. 3). The underfill resin 105 is cured. The above manufacturing steps manufacture the semiconductor device 100 that is illustrated in FIG. 3.

In the present embodiment, the wiring structure 11 is one example of a first wiring structure. The wiring structure 12 is one example of a second wiring structure. The wiring layer 22 is one example of a first wiring layer. The insulation layer 31 is one example of a first insulation layer. Each of the through holes 31X is one example of a first through hole. Each of the via wirings 32 is one example of a first via wiring. The wiring layer 50 is one example of a second wiring layer. Each of the wiring patterns 50A is one example of a third wiring pattern. Each of the wiring patterns 50B is one example of a first wiring pattern. Each of the wiring patterns 50C is one example of a second wiring pattern. The metal film 52 is one example of a metal barrier film. The insulation layer 61 is one example of a second insulation layer. Each of the through holes 61X is one example of a second through hole. The wiring layer 70 is one example of a third wiring layer. Each of the via wirings 70V is one example of a second via wiring.

The present embodiment has the advantages described below.

(1) In the wiring structure 12, the smooth surface 54C forms at least a portion of the upper surface of the wiring layer 50 on which the via wirings 70V are formed. The rough surface 54A forms a portion of the upper surface of the wiring layer 50 excluding the smooth surface 54C. The protective films 55 cover the smooth surfaces 54C and expose the rough surfaces 54A. The insulation layer 61 is formed on the upper surface 31A of the insulation layer 31 to cover the wiring layer 50 and the protective films 55. The through holes 61X extend through the insulation layer 61 in the thickness-wise direction to partially expose the upper surfaces of the protective films 55. The through holes 61X are filled with the via wirings 70V, which connect the wiring layer 50 to the wiring layer 70. The upper surfaces of the protective films 55 are formed by the smooth surfaces 55A, which have lower roughness than the rough surfaces 54A. Thus, the bottom surfaces of the via wirings 70V are connected to the smooth surfaces 55A (upper surfaces of protective films 55). This obtains smooth boundary surfaces of the metal film 72, which defines the lowermost layer of the via wirings 70V, and the upper surfaces (smooth surfaces 55A) of the protective films 55. Accordingly, formation of voids in the boundary surfaces is appropriately limited. This limits separation of the bottoms of the via wirings 70V from the protective films 55 (i.e., via pads) and occurrence of bad conductivity (bad connection) between the via wirings 70V and the protective films 55 (wiring layer 50). Thus, the connection reliability of the via wirings 70V and the protective films 55 (wiring layer 50) is increased.

(2) The upper surface of each wiring pattern 50B is formed by the smooth surface 54C and the rough surface 54A, which are continuous with each other. The rough surface 54A is downwardly recessed from the smooth surface 54C to expose the lower surface of the peripheral portion of the protective film 55. This forms the protective film 55 having the overhang structure, in which the peripheral portion of the protective film 55 outwardly projects from the smooth surface 54C and the lower surface of the protective film 55 is exposed from the metal layer 54 (wiring layer 50). The insulation layer 61 extends under the overhang structure and covers the upper, lower, and side surfaces of the peripheral portion of the protective film 55. This appropriately limits separation of the insulation layer 61 from the protective film 55 and the wiring layer 50.

(3) The wiring layer 50 includes wiring patterns, which have small surface areas, that is, include fine wiring. In the present example, the wiring layer 50 includes the wiring patterns 50C. The surface of each wiring pattern 50C is formed by the smooth surfaces 53D, 54C, 54D. The protective film 55 is formed on the smooth surfaces 53D, 54C, 54D. The protective film 55 is located between the metal film 53 and the insulation layer 61 and between the metal layer 54 and the insulation layer 61. This appropriately limits occurrence of migration such as electromigration and ion migration between the metal film 53 and the insulation layer 61 and between the metal layer 54 and the insulation layer 61. Therefore, even when the wiring layer 50 becomes finer, problems caused by such migration are appropriately limited.

The surface of the wiring patterns having large surface areas such as the wiring patterns 50A, 50B is entirely or partially formed by the rough surfaces 53B, 54A, 54B. This increases the adhesiveness of the wiring layer 50 and the insulation layer 61 as compared to when the entire surface of the wiring layer 50 is formed by a smooth surface.

Therefore, increases in the resistance of fine wiring portions of the wiring layer 50 are appropriately limited while increasing the adhesiveness of the wiring layer 50 and the insulation layer 61.

(4) In each wiring pattern 50B, which has a large surface area of the metal layer 54, the protective film 55 covers the side surface (smooth surface 54D) of the metal layer 54. This structure reduces the potential difference between the wiring pattern 50B and another wiring pattern (e.g., wiring pattern 50C) in which the protective film 55 is formed on the side surface of the metal layer 54.

Figure 18:
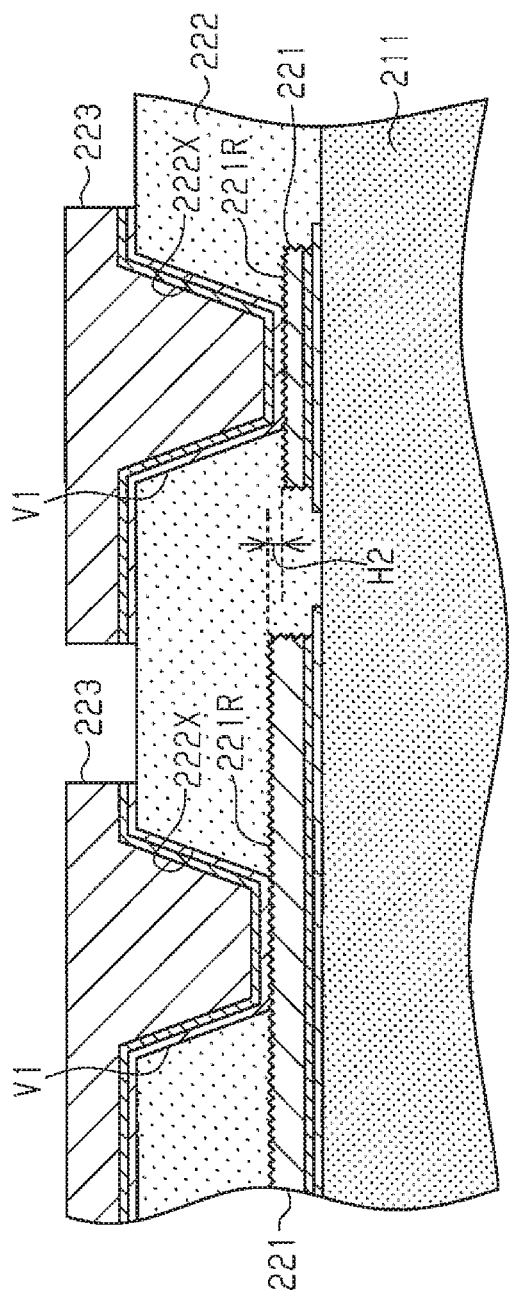
FIG. 18 is a schematic cross-sectional view illustrating the shortcoming of a related art wiring substrate.

(5) As illustrated in FIG. 18, the wiring substrate 200, which includes the rough surfaces 221R defining via pads, tends to have variations in the height of the via pads. The height variations occur, for example, if differences in the exposed area of the wiring layer 221 cause the etching amount to vary when the roughening process is performed on the wiring layer 221 and result in variations in the thickness of the wiring layer 221 after the roughening process. For example, after the roughening process, the wiring layer 221 located at the right side in FIG. 18 is thinner than the wiring layer 221 located at the left side in FIG. 18 by a thickness H2. Accordingly, the height-wise position of the via pad located at the right side in FIG. 18 is lower than the height-wise position of the via pad located at the left side in FIG. 18 by an amount corresponding to the thickness H2. This generates variations in the thickness of the insulation layer 222, which is formed immediately above the wiring layer 221 (via pad). This, in turn, generates variations in the depth of the through holes 222X extending through the insulation layer 222 in the thickness-wise direction. The variations in the depth of the through holes 222X cause the aspect ratio of the through holes 222X to increase. Thus, the through holes 222X tend to have anomalous openings (malformed openings).

Figure 17:
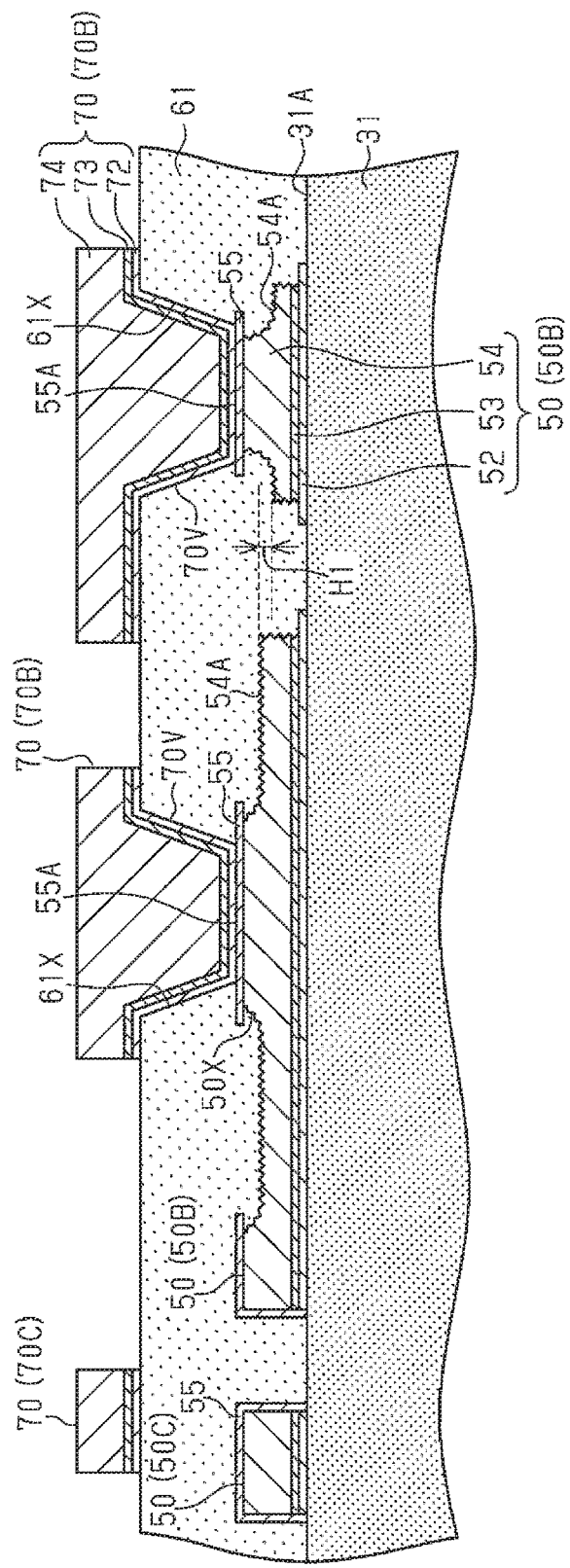
FIG. 17 is a schematic cross-sectional view illustrating the operation of the wiring substrate of the embodiment.

In this regard, as illustrated in FIG. 17, in the present embodiment, the via pads are formed by the protective films 55. The protective films 55 are used as the etching mask when the roughening process (etching) is performed on the wiring layer 50. Thus, even when differences in the etching amount of the wiring layer 50 occur, the differences will not vary the heights of the protective films 55. For example, even when the upper surface (rough surface 54A) of the metal layer 54 located at the right side in FIG. 17 is lower than the upper surface (rough surface 54A) of the metal layer 54 located at the left side in FIG. 17 by a thickness H1 after the roughening process, the heights of the protective films 55 located at the left and right sides in FIG. 17 subtly change between before and after the roughening process. Thus, variations in the heights of the protective films 55 (via pads) are limited as compared to the wiring substrate 200 of FIG. 18. This limits variations in the thickness of the insulation layer 61, which is formed immediately above the protective films 55 (via pads). This, in turn, limits variations in the depth of the through holes 61X in the insulation layer 61. Therefore, the formation of anomalous opening of the through holes 61X is appropriately limited. Accordingly, the bad connection is limited between the via wirings 70V, with which the through holes 61X are filled, and the protective films 55. This increases the connection reliability of the via wirings 70V and the protective films 55 (wiring layer 50).

(6) The protective films 55 are formed on the wiring layer 50 to function as the via pads. This decreases the aspect ratio of the through holes 61X by an amount corresponding to the thickness of the protective films 55. Thus, the formation of anomalous opening of the through holes 61X is further appropriately limited.

Figure 19:
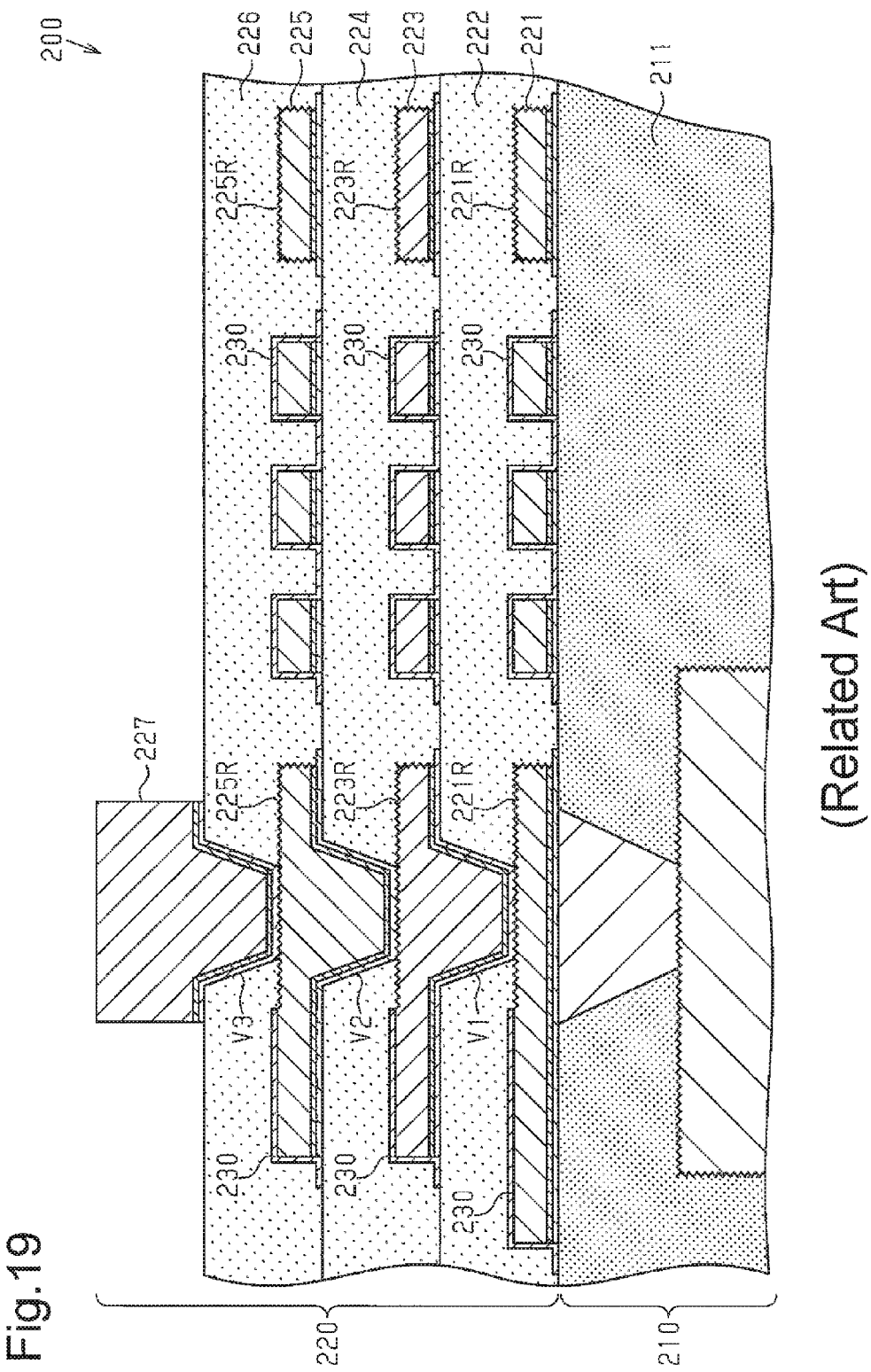
FIG. 19 is an enlarged cross-sectional view illustrating the related art wiring substrate.

(7) In the wiring substrate 200 that is illustrated in FIG. 19, after the rough surface 221R is partially formed in the surface of the wiring layer 221, the protective films 230 may be formed on the entire surface of the wiring layer 221. However, in this case, if the protective films 230 are thick enough to function as anti-oxidation or the like, the irregularities of the rough surface 221R are filled with the protective films 230. Thus, the formation of such protective films 230 lowers the adhesiveness between the insulation layer 222 and the wiring layer 221 and between the insulation layer 222 and the protective films 230. Consequently, separation or swell of the insulation layer 222 tends to occur between the protective films 230 and the insulation layer 222.

In this regard, in the present embodiment, the protective films 55 are formed on only the smooth surfaces 53D, 54C, 54D of the wiring layer 50 without forming the protective films 55 on the rough surfaces 53B, 54A, 54B of the wiring layer 50. This appropriately limits decreases in the adhesiveness between the insulation layer 61 and the protective films 55 that would be caused by the formation of the protective films 55.

It should be apparent to those skilled in the art that the foregoing embodiment may be employed in many other specific forms without departing from the scope of the invention. Particularly, it should be understood that the foregoing embodiment may be employed in the following forms.

In the above embodiment, the wiring patterns that include the rough surfaces 53B, 54A, 54B and the smooth surfaces 53D, 54C, 54D are not limited to the wiring patterns 50B. Any wiring pattern having a large surface area of the metal layer 54 may include the rough surfaces 53B, 54A, 54B and the smooth surfaces 53D, 54C, 54D. For example, when the surface of the wiring pattern 50A is partially formed by the smooth surfaces 53D, 54C, 54D, the remaining surface of the wiring pattern 50A may be formed by the rough surfaces 53B, 54A, 54B.

The wiring layer 50 of the above embodiment includes the wiring patterns 50A to 50C, which are, for example, coplanar with each other. Instead, for example, the wiring layer 50 may include only the wiring patterns 50B, only the wiring patterns 50A, 50B, or only the wiring patterns 50B, 50C. Thus, at least one of the set of the wiring patterns 50A and the set of the wiring patterns 50C may be omitted.

In the above embodiment, a solder resist layer may be formed on the upper surface of the uppermost insulation layer 65 of the wiring substrate 10. The upper surface of the insulation layer 65 functions as a chip mount surface, on which the semiconductor chip 101 is mounted. The solder resist layer may be formed on such a chip mount surface (upper surface of insulation layer 65). For example, a frame-shaped solder resist layer may be formed on the insulation layer 65 to surround the chip mount region where one or more semiconductor chips 101 are mounted.

In the above embodiment, the upper end surfaces 32A of the via wirings 32 are flush with the upper surface 31A of the insulation layer 31. Instead, for example, the upper end surfaces 32A of the via wirings 32 may be downwardly recessed from the upper surface 31A of the insulation layer 31. Alternatively, the upper end surfaces 32A of the via wirings 32 may upwardly project from the upper surface 31A of the insulation layer 31.

In the above embodiment, the cross-sectional shape of each through hole in the wiring substrate 10 is not particularly limited. The through hole in the wiring substrate 10 may be, for example, extended straight (rectangular in cross-sectional view).

In the above embodiment, the wiring structure 11 may have any number of wiring layers and insulation layers and various kinds of wiring arrangement. For example, the number of wiring layers and insulation layers stacked on the upper surface 20A and the lower surface 20B of the core substrate 20 may be changed.

In the above embodiment, the wiring layers that are arranged above and below the core substrate 20 are electrically connected to each other by the through electrodes 21, with which the through holes 20X of the core substrate 20 are filled. Instead, the wiring layers arranged above and below the core substrate 20 may be electrically connected to each other, for example, by a through hole plating layer (through electrode) formed on wall surfaces of the through holes 20X. In this case, an inner region surrounded by the through hole plating layer in the through holes 20X may be filled with a resin.

In the above embodiment, the wiring structure 11 has a build-up core structure including the core substrate 20. Instead, for example, the wiring structure 11 may be changed to a coreless structure, which does not include a core substrate.

In the above embodiment, the wiring structure 12 may have any number of the wiring layers 50, 70, 80, 90 and the insulation layers 61, 63, 65 and various kinds of wiring arrangement.

In the above embodiment, the semiconductor chip 101 is mounted on the wiring substrate 10. Instead of the semiconductor chip 101, for example, a chip component such as a chip capacitor, a chip resistor, or a chip inductor may be mounted on the wiring substrate 10. Alternatively, an electronic component other than a semiconductor chip such as a crystal oscillator may be mounted on the wiring substrate 10.

The mounting mode (e.g., flip-chip-mounting, wire-bonding-mounting, solder-mounting, or combination of these) of the electronic component such as the semiconductor chip 101, a chip component, or a crystal oscillator may be changed.

CLAUSES

This disclosure further encompasses embodiments described below.

1. A method for manufacturing a wiring substrate, the method including:

forming a first wiring structure; and stacking a second wiring structure on an upper surface of the first wiring structure, wherein the second wiring structure has a higher wiring density than the first wiring structure, wherein the forming a first wiring structure includes forming a first insulation layer that covers a first wiring layer, forming a first through hole that extends through the first insulation layer in a thickness-wise direction to expose an upper surface of the first wiring layer, forming a conductive layer, with which the first through hole is filled, wherein the conductive layer covers an upper surface of the first insulation layer, and polishing the conductive layer and the first insulation layer to smooth the upper surface of the first insulation layer and form a first via wiring that includes an upper end surface which is exposed from the first insulation layer, the stacking a second wiring structure includes forming a second wiring layer by sequentially stacking a metal barrier film, a metal film, and a metal layer on the upper surface of the first insulation layer and the upper end surface of the first via wiring, forming a protective film, which is formed from a conductive material having a higher migration resistance than the metal film and the metal layer, on a portion of an upper surface of the second wiring layer, forming a rough surface in the upper surface of the second wiring layer to expose a lower surface of a peripheral portion of the protective film from the second wiring layer, forming a second insulation layer on the upper surface of the first insulation layer to cover the second wiring layer and the protective film, forming a second through hole that extends through the second insulation layer in the thickness-wise direction to expose an upper surface of the protective film, and forming a third wiring layer that includes a second via wiring, with which the second through hole is filled, wherein the third wiring layer is electrically connected to the second wiring layer by the second via wiring, wherein the second insulation layer covers an upper surface, a lower surface, and a side surface of the peripheral portion of the protective film.

2. The method according to clause 1, wherein the forming a protective film includes forming a resist layer on the first insulation layer, wherein the resist layer includes an opening pattern that exposes the upper surface of the second wiring layer in a region of the second wiring layer connected to the second via wiring, forming the protective film on the upper surface of the second wiring layer, which is exposed from the opening pattern, through an electroless plating process, and removing the resist layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
a first wiring structure that includes
a first wiring layer,
a first insulation layer that covers the first wiring layer,
a first through hole that extends through the first insulation layer in a thickness-wise direction and exposes an upper surface of the first wiring layer, and
a first via wiring, with which the first through hole is filled, wherein the first via wiring includes an upper end surface that is exposed from the first insulation layer; and
a second wiring structure stacked on an upper surface of the first insulation layer and having a higher wiring density than the first wiring structure, wherein the second wiring structure includes
a second wiring layer formed on the upper surface of the first insulation layer and the upper end surface of the first via wiring, wherein the second wiring layer includes a first wiring pattern, the first wiring pattern includes a smooth surface and a rough surface having a higher roughness than the smooth surface, the smooth surface forms a portion of an upper surface of the first wiring pattern, and the rough surface forms a remaining portion of the upper surface of the first wiring pattern,
a protective film formed from a conductive material having a higher migration resistance than the second wiring layer, wherein the protective film covers the smooth surface and exposes the rough surface, and the protective film includes a smooth upper surface having a lower roughness than the rough surface,
a second insulation layer stacked on the upper surface of the first insulation layer, wherein the second insulation layer covers the second wiring layer and the protective film,
a second through hole that extends through the second insulation layer in the thickness-wise direction and exposes the upper surface of the protective film, and
a third wiring layer including a second via wiring, with which the second through hole is filled, wherein the third wiring layer is connected to the second wiring layer by the second via wiring, wherein
the rough surface is continuous with the smooth surface and downwardly recessed from the smooth surface to expose a lower surface of a peripheral portion of the protective film, and
the second insulation layer covers a side surface, an upper surface, and the lower surface of the peripheral portion of the protective film.

2. The wiring substrate according to claim 1, wherein
the lower surface of the peripheral portion of the protective film is entirely exposed from the second wiring layer, and
the rough surface is sloped up toward an edge of the smooth surface of the second wiring layer below the peripheral portion of the protective film.

3. The wiring substrate according to claim 1, wherein the first wiring pattern of the second wiring layer includes
a first seed layer that includes a first metal barrier film and a first metal film, wherein the first metal barrier film is formed on the upper surface of the first insulation layer and the upper end surface of the first via wiring, and the first metal film is formed on the first metal barrier film, and
a first metal layer formed on the first seed layer.

4. The wiring substrate according to claim 3, wherein the first metal layer includes
an upper surface that includes the smooth surface and the rough surface, which form the upper surface of the first wiring pattern, and
a smooth side surface that is continuous with the smooth surface of the upper surface of the first metal layer,
the first metal film includes a smooth side surface that is continuous with the smooth side surface of the first metal layer, and
the protective film covers the smooth surface of the upper surface of the first metal layer, the smooth side surface of the first metal layer, and the smooth side surface of the first metal film.

5. The wiring substrate according to claim 1, wherein the second wiring layer further includes a second wiring pattern, the second wiring pattern including
- a second seed layer that includes a second metal barrier film and a second metal film, wherein the second metal barrier film is formed on the upper surface of the first insulation layer, and the second metal film is formed on the second metal barrier film, and
- a second metal layer formed on the second seed layer, an entire side surface of the second metal film is formed by a smooth surface, an entire upper surface of the second metal layer and an entire side surface of the second metal layer are formed by a smooth surface, and the protective film further covers the smooth surface of the second metal film and the smooth surface of the second metal layer.

6. The wiring substrate according to claim 1, wherein the second wiring layer further includes a third wiring pattern, the third wiring pattern including
- a third seed layer that includes a third metal barrier film and a third metal film, wherein the third metal barrier film is formed on the upper surface of the first insulation layer, and the third metal film is formed on the third metal barrier film, and
- a third metal layer formed on the third seed layer, an entire side surface of the third metal film is formed by a rough surface, an entire upper surface of the third metal layer and an entire side surface of the third metal layer are formed by a rough surface, and the third metal barrier film includes an edge portion that outwardly projects from a side surface of the third metal film and a side surface of the third metal layer.

7. The wiring substrate according to claim 1, wherein
the first insulation layer is formed from a non-photosensitive insulative resin containing a thermosetting resin as a main component,
the second insulation layer contains a photosensitive resin as a main component, and
the second insulation layer is thinner than the first insulation layer.

8. A semiconductor device comprising:
the wiring substrate according to claim 1; and
a semiconductor chip that is flip-chip-mounted on an uppermost wiring layer of the second wiring structure.

9. The wiring substrate according to claim 1, wherein
the second via wiring is formed on the upper surface of the protective film, and
the third wiring layer is connected to the second wiring layer by the second via wiring and the protective film.

* * * * *